(12) United States Patent
Sunter et al.

(10) Patent No.: US 6,396,889 B1
(45) Date of Patent: May 28, 2002

(54) METHOD AND CIRCUIT FOR BUILT IN SELF TEST OF PHASE LOCKED LOOPS

(75) Inventors: Stephen Kenneth Sunter, Nepean; Aubin P. J. Roy, Hull, both of (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 09/184,516

(22) Filed: Nov. 2, 1998

(30) Foreign Application Priority Data

Nov. 3, 1997 (CA) ............................................ 2220622

(51) Int. Cl.[7] ................................................ H03D 3/24
(52) U.S. Cl. ...................................................... 375/376
(58) Field of Search ................................. 375/376, 374, 375/375, 371, 373, 327, 294; 327/147, 148, 156, 157, 158, 146; 329/328

(56) References Cited

U.S. PATENT DOCUMENTS

| | | | |
|---|---|---|---|
| 4,412,299 A | 10/1983 | Huffman ...................... 364/570 |
| 4,754,216 A | 6/1988 | Wong ........................... 324/83 |
| 4,935,706 A | * 6/1990 | Schenberg .................... 331/11 |
| 5,038,120 A | 8/1991 | Wheatley et al. ........... 332/128 |
| 5,214,955 A | 6/1993 | Yost et al. .................. 73/24.05 |
| 5,295,079 A | 3/1994 | Wong et al. ................. 364/481 |
| 5,327,031 A | * 7/1994 | Marbot et al. ............... 327/276 |
| 5,446,648 A | 8/1995 | Abramovitch et al. ....... 364/148 |
| 5,574,406 A | 11/1996 | Sauer et al. ................... 331/11 |
| 5,663,991 A | 9/1997 | Kelkar et al. ............... 375/376 |
| 5,745,011 A | * 4/1998 | Scott ............................ 331/44 |
| 5,764,092 A | * 6/1998 | Wada et al. ................. 327/271 |
| 5,805,003 A | * 9/1998 | Hsu ........................... 327/270 |

* cited by examiner

Primary Examiner—Tesfaldey Bocure
Assistant Examiner—Khai Tran
(74) Attorney, Agent, or Firm—Skjerven Morrill LLP; David W. Heid

(57) ABSTRACT

A method of testing phase locked loops (PLL) and a testing circuit comprising the steps of applying a normal stimulus signal whose frequency is within the lock range of the PLL to the input of the PLL, substituting the normal input stimulus with an alternative signal derived from an internal feedback of the PLL, adding or deleting one or more cycles from the alternative signal and observing the response of the PLL to the alternative signal. Variations of the method allow for determining Gain-Bandwidth product, lock range, lock time, Bit Error Rate, Jitter and other parameters which can then be compared with predetermined values to determine whether the PLL is properly functional.

41 Claims, 15 Drawing Sheets

METHOD AND CIRCUIT FOR BUILT IN SELF TEST OF PHASE LOCKED LOOPS

The present invention relates, in general, to testing of Phase Locked Loops and, more specifically, to a method and circuitry for Built In Self Test (BIST) of Phase Locked Loops incorporated into integrated circuits.

BACKGROUND OF THE INVENTION

Phase locked loops (PLLs) are used in many electronics applications. Some are used to derive a synchronous clock signal from serial data, some are used to derive a higher frequency synchronous clock signal from a lower frequency clock, and some are used to generate a delayed clock signal whose phase is aligned to a clock signal with the same frequency. PLLs are used in many digital integrated circuits, but are partially analog or mixed-signal in nature. Their performance is thus non-deterministic and testing them in a manufacturing environment can often be time-consuming or inadequate, especially if only conventional synchronous digital tests are used.

The most important PLL parameters which are typically tested include lock time, lock range, phase jitter, phase error, and the induced bit error rate (BER). As is done for most mixed-signal functions, these parameters are typically measured functionally, i.e. by applying stimulus that the PLL would be subjected to in the target application and measuring its response. These tests can be time-consuming to create, require long test times, and require high precision testers. For example, lock range is typically measured, after phase lock has been achieved, by gradually increasing or decreasing the stimulus frequency until the phase is no longer locked. This requires a tester with precise control of signal transition timing. BER is measured over extended periods of time (minutes or hours), or else a low-level signal with a precise amplitude is used to induce an increased BER. This requires a tester with precise output voltages, possibly at high frequencies.

SUMMARY OF THE INVENTION

It is an object of this invention to provide a circuit and method for testing PLLs in a way which is comparable to tests which are typically used, but in a way which is simple enough to economically include within an integrated circuit containing the PLL and thus facilitate built-in self-test (BIST). The BIST circuit described herein is connected only to the normal input and output signals of the PLL, hence does not interfere with internal circuitry, does not affect the normal capabilities of the PLL, and does not depend on whether the PLL's internal operation is digital or analog. This contrasts significantly with, for example, U.S. Pat. No. 5,295,079 by Hee Wong et al, which requires several connections to the internal circuitry of the PLL, and in a way which is very dependent on the exact nature of the PLL.

To test a PLL, the new BIST circuit described herein is connected to the PLL and an input stimulus clock with mid-range frequency for the PLL is also connected. The BIST circuit provides a substitute clock input derived from the PLL output clock and has the same phase and frequency as the stimulus clock to the PLL. When the circuit is enabled, the PLL continues to generate approximately the same frequency. The feedback clock is then interrupted for one or more cycles. The output frequency of the PLL responds to these missing cycles in a way which is precisely proportional to the product of the loop gain and the loop bandwidth for the PLL. The change in frequency is easily measured using conventional means, on-chip. The loop Gain Bandwidth is proportional to the square of the natural frequency, $f_n$, of the PLL. $f_n$ is an important PLL design parameter.

The lock range of the PLL is measured similarly to the above procedure, except that the derived signal is continuously interrupted, causing the output frequency of the PLL to continuously decrease until it reaches its lowest possible frequency. This frequency is measured using conventional means, and is equal to the lowest frequency within the lock range of the PLL. A similar procedure leads to the highest frequency. When the lowest or highest frequency is attained, the stimulus clock is reconnected and the time to attain phase lock is measured by counting clock pulses—this give the lock time.

The jitter within the PLL is measured by connecting an edge-triggered latch between the input clock and the output clock and determining the amount of delay which must be added to or removed from the clock signal to ensure that the output of the latch is a predictable series of ones and zeroes.

For a receiver whose data clock is generated from the received data, the BER is predicted by testing the BER for various, precisely added phase offsets. When the phase offset becomes large relative to the normal offset, the BER becomes much worse than normal and can be measured in a much shorter time.

Knowing several exact phase offsets and resulting BERs, the BER can be predicted for zero phase offset. A problem with this approach has been the difficulty in generating small and precise increments in phase — the method of the present invention achieves the needed precision.

BRIEF DESCRIPTION OF THE DRAWINGS

These and other features of the invention will become more apparent from the following description in which reference is made to the appended drawings wherein:

FIG. 9, is a flow chart illustrating method, according to a preferred embodiment of the present invention, of measuring the phase jitter of a PLL;

DETAILED DESCRIPTION OF PREFERRED EMBODIMENTS OF THE INVENTION

There are several types of phase comparators used in PLLs.

Figure 1:
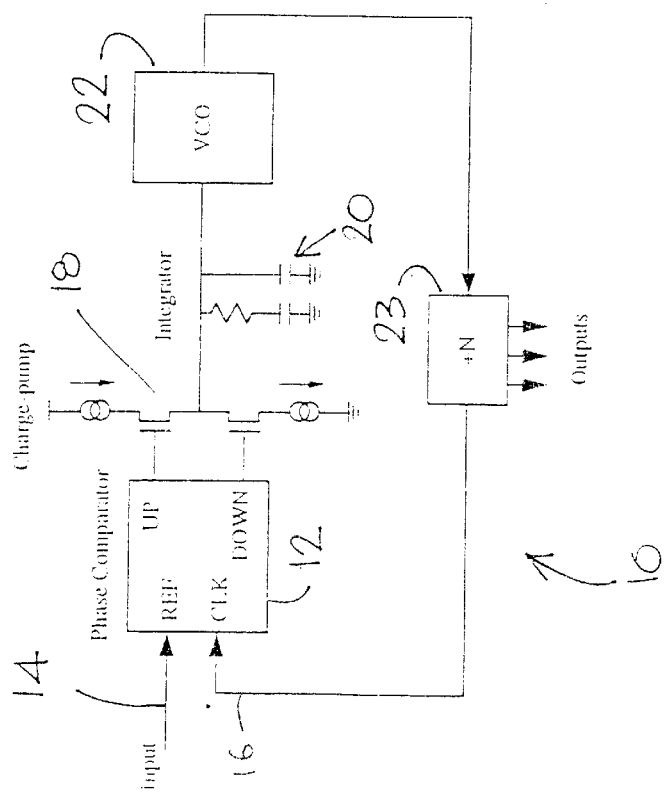
FIG. 1 diagrammatically illustrates a typical charge-pump type PLL.

FIG. 1 illustrates a PLL 10 having a phase comparator 12 which has a reference input 14 and a feedback input 16 and provides a three-state output 18 to an integrator 20 which drives a voltage controlled oscillator (VCO) 22. The output of the VCO is input to a ÷N divider 23 from which three PLL outputs and the feedback input 16 are derived. When no phase error exists, the output of the phase comparator is high impedance. The most common example is a phase-frequency sensitive phase comparator based on digital latches and is called a charge-pump phase comparator.

Figure 2:
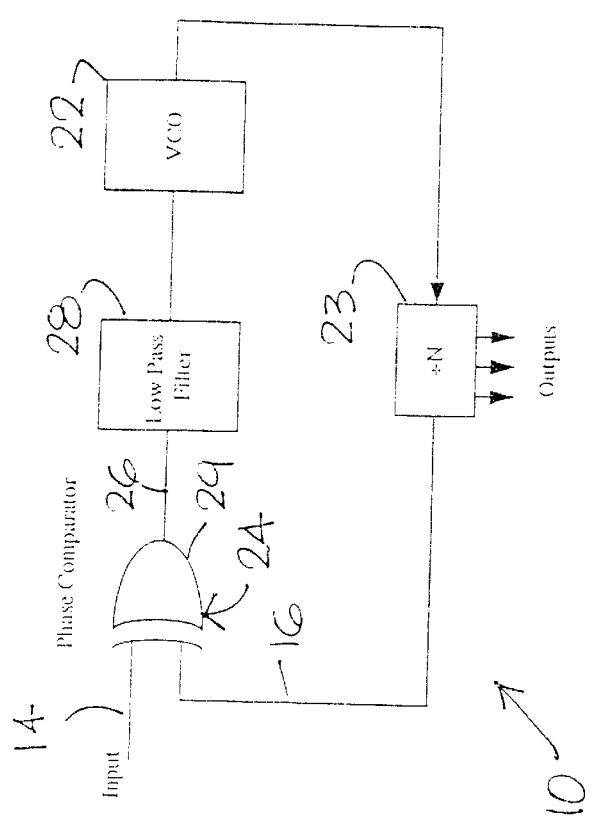
FIG. 2 diagrammatically illustrates a typical Exor type PLL.

FIG. 2 illustrates a PLL 10 having a second type of phase comparator 24 which provides a two-state output 26 to a low pass filter 28 which drives the VCO 22. As in the PLL of FIG. 1, the output of the VCO is input to a ÷N divider 23 from which three PLL outputs and the feedback input 16 are derived. When there is no phase error, the output alternates between logic high and low with a constant duty cycle (50% when at the middle of the frequency range). The most common example of this type of phase comparator is the simple exclusive-or (Exor) logic gate 29, shown in FIG. 2, which is sensitive to phase error and not frequency error.

The invention described herein requires different operation depending on which type of phase comparator is used. The description will address the charge pump-type PLL first, and will later address the minor modifications needed to address the Exor-type PLL.

As mentioned earlier, there are primarily three different applications for PLLs. Two applications are clock generation at a different frequency or phase relative to an input clock. A third application is generation of a sampling clock from an input serial data stream containing noise so as to facilitate optimal sampling of the data values. The present invention addresses all three applications.

To begin testing a PLL, power is applied and a continuous clock input is provided at any frequency within the nominal lock range of the PLL, preferably in the center of the range. For PLLs which normally receive data (from which a clock is to be derived), the data provided is alternating 1's and 0's so as to appear as a clock whose frequency is one-half the data rate. The data provided can also be normal data, random or a pseudo random bit stream. It is preferable that the test is automatically initiated, in test mode, as soon as phase-lock is detected by conventional means, or as soon as the PLL output frequency is within a specified range of input frequency.

The following description describes circuits and methods for measuring Loop Gain-bandwidth Product (GBW) for Charge Pump-Type and Exor-Type PLLs. It should be understood at the outset that the circuitry described below is intended to be built into an integrated circuit in order to provide Built-In Self-Test (BIST) capabilities. As is well known to those skilled in the art, integrated circuits are designed means of a Hardware Development Language (HDL). Thus, the HDL code and the programs which utilize the code to develop the gate level circuitry determine the precise configuration of the circuitry and the integrated circuit and of the BIST circuits described herein. As indicated earlier, the present invention describes methods for measuring several PLL parameters. Not all of the parameters need to be measured in all integrated circuits. The parameters which are measured depend on the wishes of circuit designer who may be constrained by cost. Thus, the drawings illustrated herein are in the form of functional block diagrams.

Measurement of Loop GBW for Charge Pump-type PLL

Figure 3:
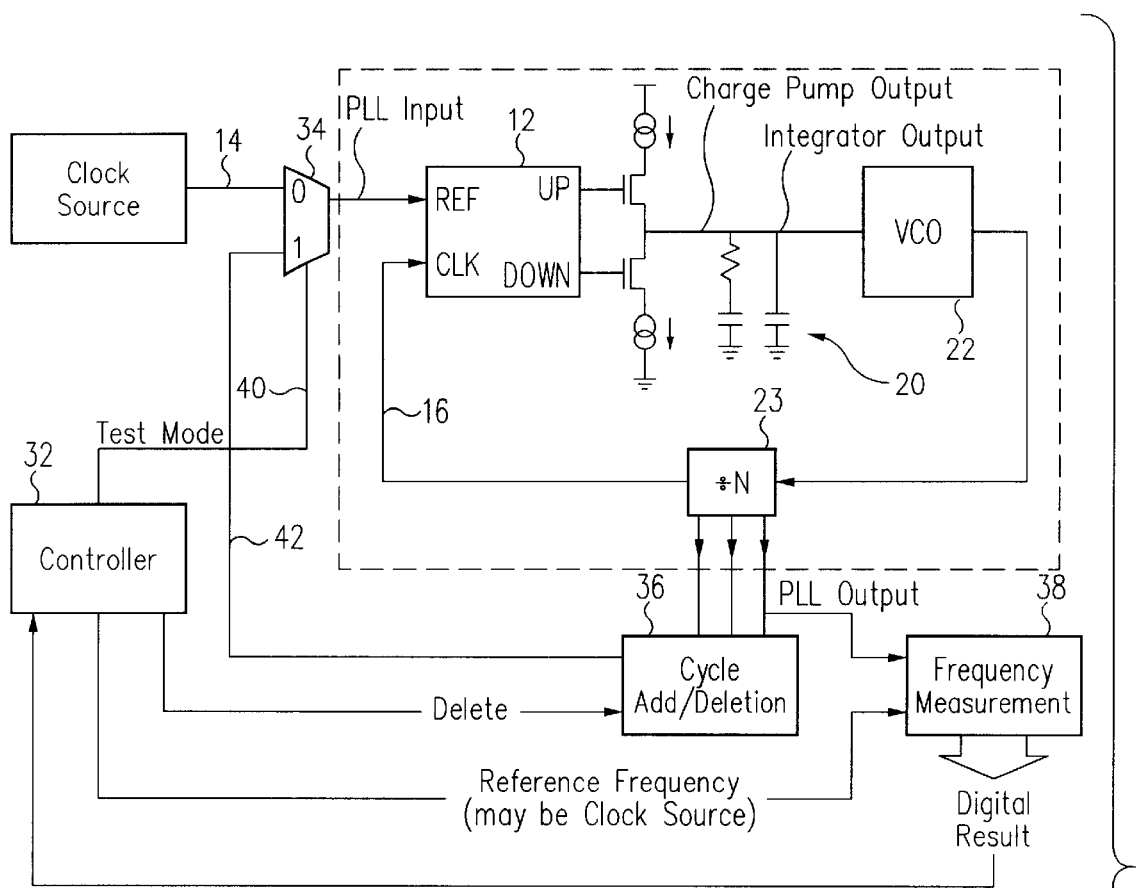
FIG. 3 diagrammatically illustrates a test circuit for a charge-pump PLL and corresponding waveforms according to a preferred embodiment of the present invention.
Figure 3:
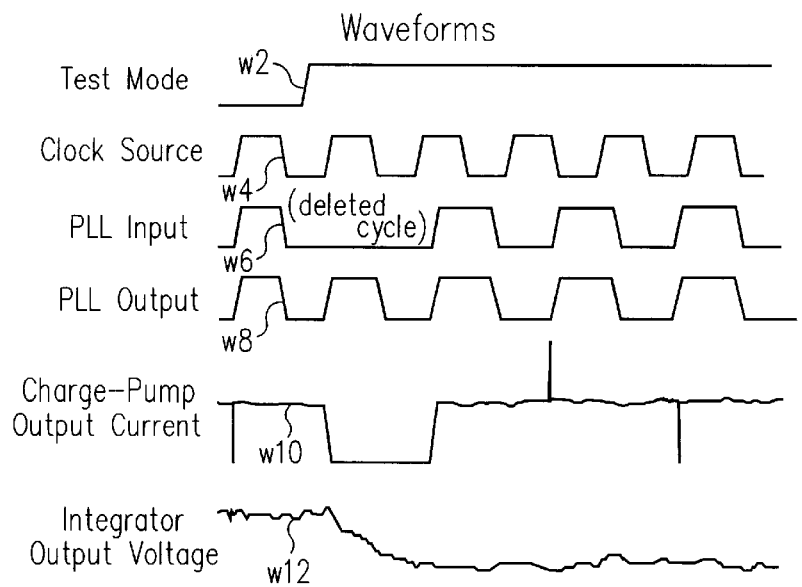

Reference will now be made to the block-level diagram in FIGS. 3 and 4, which illustrate a test circuit and a flow diagram respectively for measuring a parameter proportional to loop GBW for a charge pump-type PLL, according to one embodiment of the present invention. The test circuit, generally designated by reference numeral 30, includes a control circuit or controller 32, a multiplexer 34, a cycle addition/deletion circuit 36, illustrated in FIG. 16, and a frequency measurement circuit 38, illustrated in FIG. 15. Multiplexer 34 is controlled by a Test Mode signal 40 provided by controller 32 and receives the clock input 14 and a feedback clock signal 42 output by the cycle addition/deletion circuit 36. A nominal frequency stimulus (clock or data) is normally applied to the input of the PLL by the controller 32 applying a low level signal to the multiplexer 34 (step 46) in FIG. 4.

Self-test can typically begin only when the PLL output frequency is locked to the input frequency. Many PLLs have a phase lock output which indicates when the output phase is locked to the input phase. This 'Lock' signal can be used in test mode to initiate self-test. Alternatively, a frequency 'valid' detector (not shown) can be incorporated into controller 32 to generate an output logic signal whenever the output frequency of the PLL is within a chosen bandwidth around the input frequency. The detector can reduce test time by initiating self-test before the PLL has locked to the phase or frequency of the input signal. Thus, under the control of controller 32, the first steps in the self-test process is to either measure the PLL output frequency or observe the PLL 'Lock' signal (step 48) and determine whether the frequency is within a predetermined range or the PLL has output a 'Lock' signal (step 50).

When the PLL output frequency is valid, the controller 32 outputs a logic high Test Mode signal (line w2 in FIG. 3) to the control input of multiplexer 34 to select the feedback clock input 42 instead of the input clock 14 (line w4) (step 52). At this point, the feedback clock 42 is the same as the clock 16 fed back into the phase comparator 12 within the PLL, and therefore the phase error becomes approximately zero. The output of the phase comparator 12 becomes high impedance, and the output voltage of the charge pump integrator 20 becomes approximately constant, as shown in line w12 in FIG. 3. Typically, there will be some phase error and the integrator output voltage will slowly increase or decrease. Immediately after entering this mode, the PLL output clock frequency is measured over a time interval T and the result is denoted $f_0$ (step 54). The frequency is then immediately measured again (step 56) over another time interval T, and the result is denoted $f_1$. The value of $f_1-f_0$ is representative of the magnitude of the frequency drift due to various sources, including the phase error introduced by the test circuitry.

It is also possible to measure $f_0$ while the PLL is in the Lock state; however, the value of $f_1-f_0$ will be one-half of the value compared to the method just described.

Next, under the control of controller 32, cycle addition/deletion circuit 36 eliminates a single cycle (step 58) from the feedback clock (line w6) and then there is a pause (step 60) for a few cycles to permit transients to settle. Immediately after the cycle is eliminated, the PLL output clock frequency (line w8) is again measured over a time interval T and the result is denoted $f_2$ (step 62). The value of $(f_2-f_1)-(f_1-f_0)$ is representative of the average change in PLL output frequency during the time interval T due to the single pulse deletion and can be shown to be proportional to the loop GBW of the PLL. This value is determined (step 64) and compared to a predetermined value (step 66), which results in a 'Pass' or 'Fail' condition. The controller 32 then re-enables the normal input 14 via the multiplexer 34 (step 68).

In some cases, the frequency change caused by a single cycle deletion is too small to accurately measure in the chosen time interval T. In these cases, two or more cycles can be deleted, and the result will be proportionally larger because the change in frequency is proportional to the number of cycles replaced. In other cases, deleting even a single cycle causes excessive frequency shift. In these cases, a portion of a cycle can be deleted—for example, a quarter or an eighth of the cycle can be precisely deleted using synchronous logic. Alternatively, a combinational logic gate delay can be used to delete a constant interval of time from a cycle, and the delay of the logic gate can be measured using other means.

Figure 17:
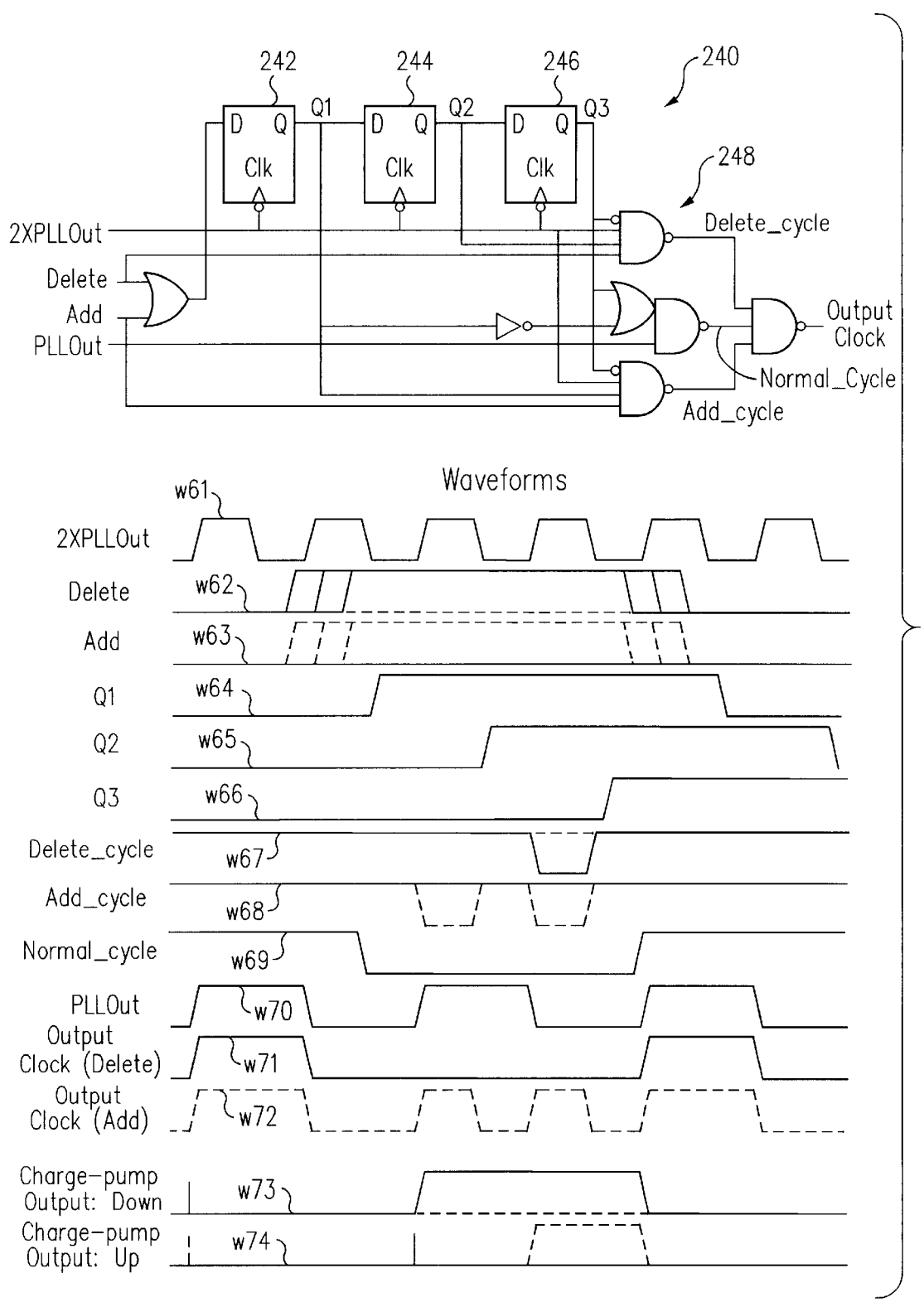
FIG. 17 diagrammatically illustrates a Cycle Addition/Deletion circuit for adding or eliminating a single cycle from a clock signal and corresponding waveforms according to a preferred embodiment of the present invention.

Another, more direct method for introducing phase shift is to use synchronous logic to continuously delay the feedback signal by 90°, 45°, 22.5° or some other angle equal to $360°/2^n$, where n is some positive integer. However, this method is only practical when the divide ratio (N in FIG. 1) is large enough to permit digital generation of the necessary delay, and when the loop GBW is not so high that the integrator output voltage goes into saturation before the frequency is measured. In general, deleting one cycle causes a −180° (or −360°, depending on phase comparator design) phase step, which decreases the output frequency the same amount as a −1° phase error for 180 (or 360) cycles. Adding one cycle, by feeding back a PLL output frequency which is twice its normal feedback frequency, causes a +180° phase step, which increases the output frequency the same amount as a +1° phase error for 180 cycles. FIG. 17 shows a circuit that can add or delete cycles, as described later.

In these cases, the result will be proportional to the phase offset.

In summary, the method described above first connects the loop feedback signal into both inputs of the phase comparator so that its output becomes independent of the VCO output and hence the PLL is tested in open-loop mode. Next, a phase error is introduced for one or more clock cycles, and the resulting change in output frequency is proportional to the loop GBW.

Measurement of Loop GBW for Exor-type PLL

Figure 5:
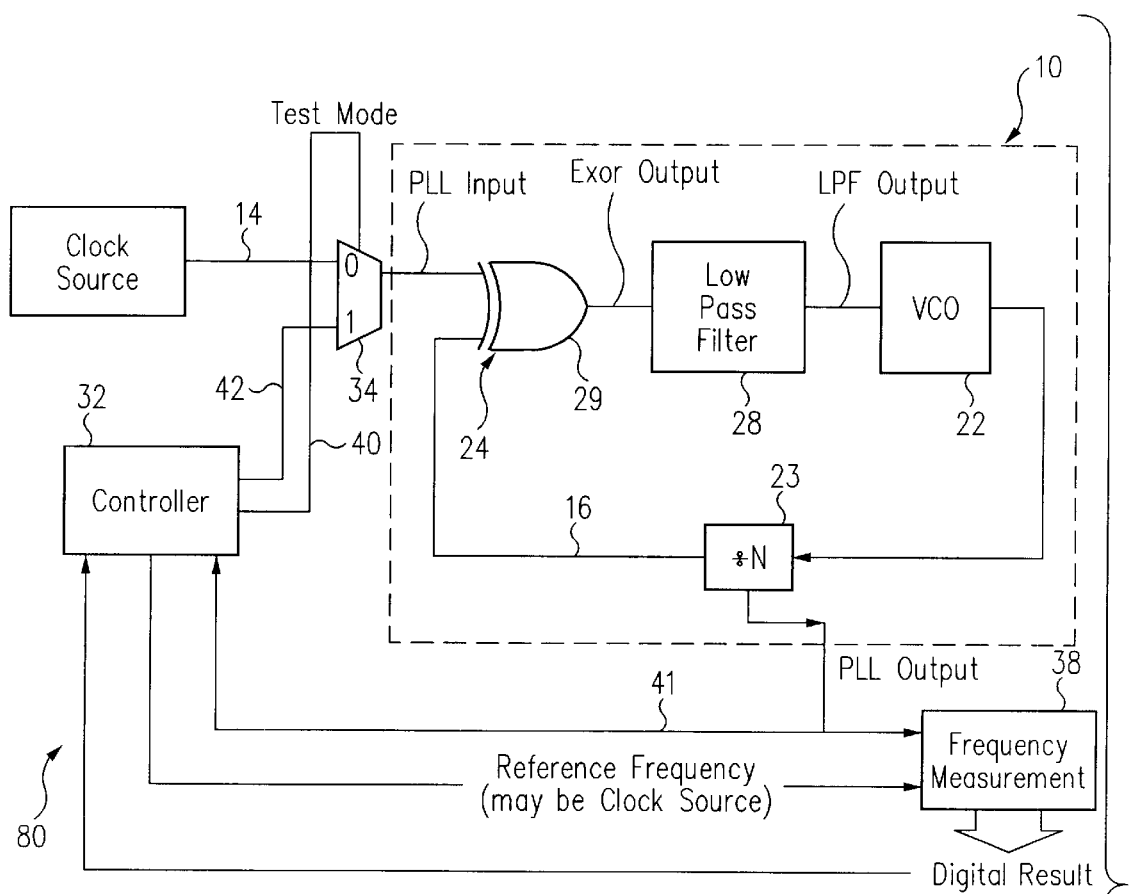
FIG. 5, located adjacent FIG. 3 diagrammatically illustrates a test circuit, according to a preferred embodiment of the present invention, for an Exor-type PLL and corresponding waveforms.
Figure 5:
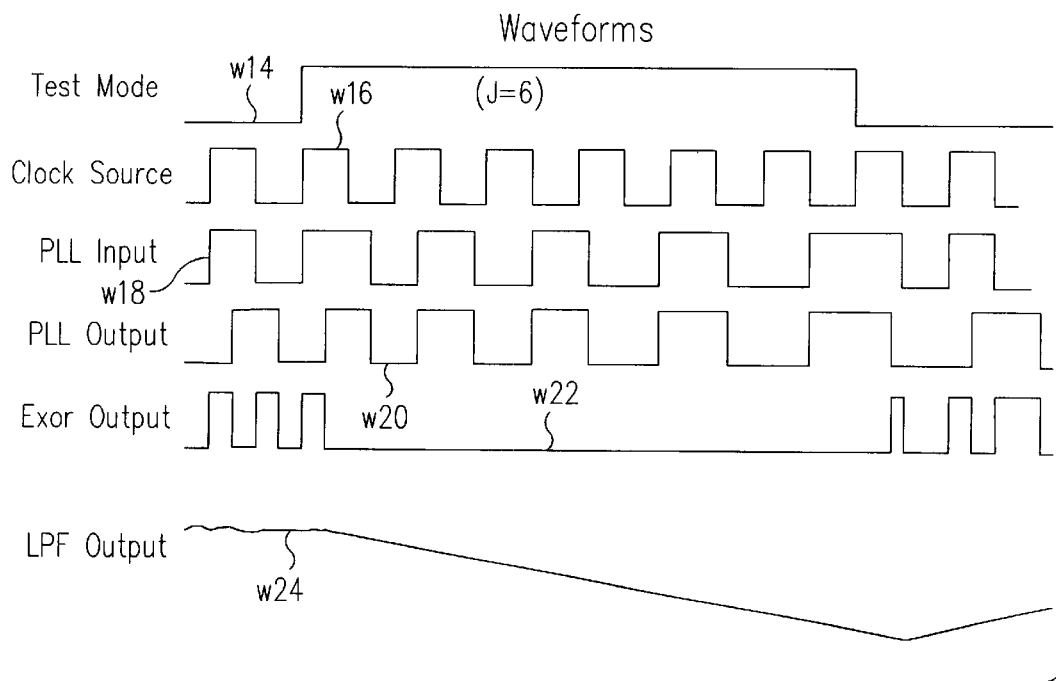
Figure 6:
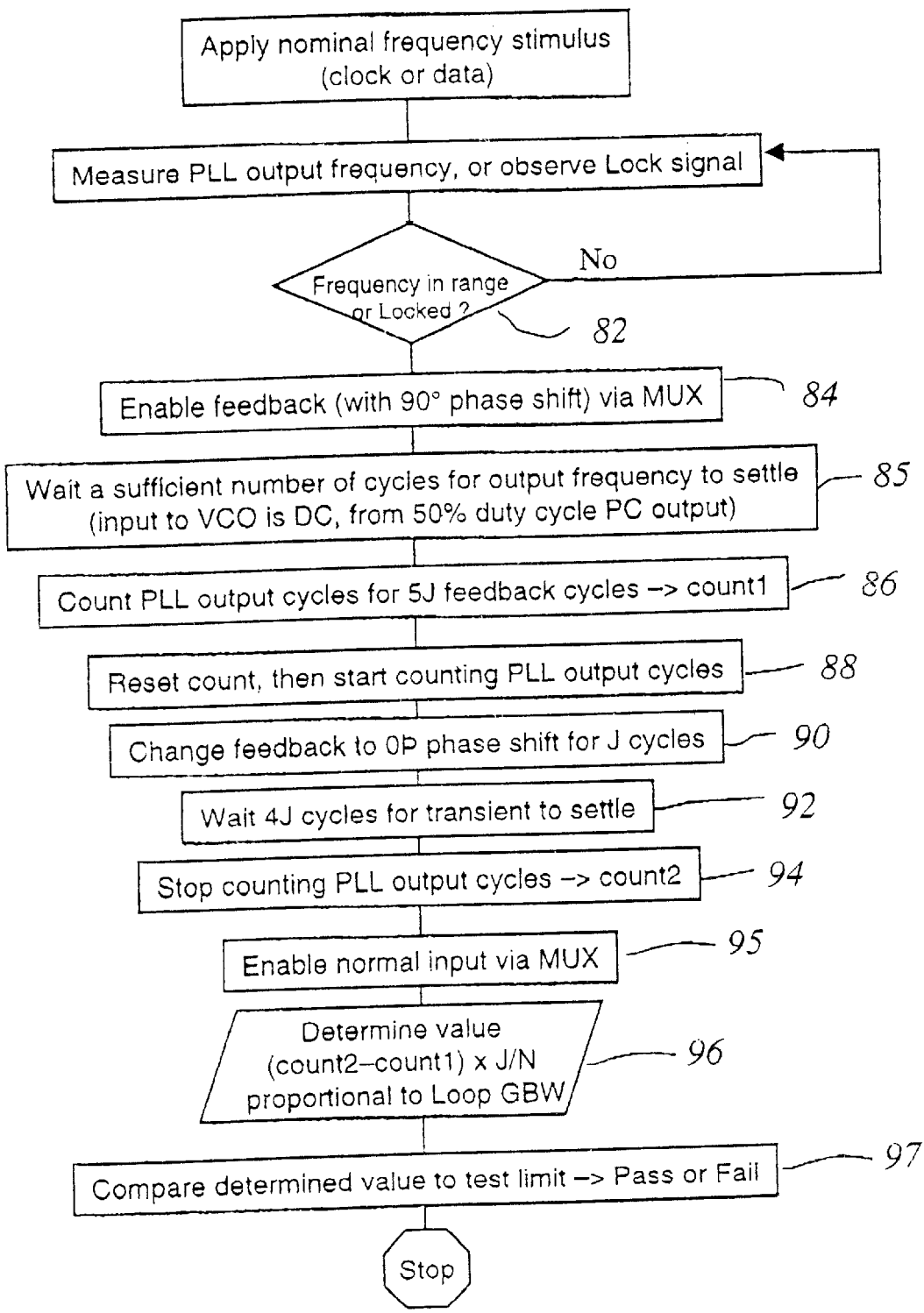
FIG. 6 is a flow chart illustrating method, according to a preferred embodiment of the present invention, of measuring the Loop Gain-Bandwidth Product for an Exor type PLL.

Reference will now be made to the block-level diagram of FIG. 5, which illustrates a test circuit 80 for measuring a parameter proportional to Loop GBW for an Exor-type PLL illustrated in FIG. 2, and to FIG. 6, which is a flow chart for measuring the parameter proportional to the loop GBW for an Exor-type PLL according to a preferred embodiment of the invention. As with test circuit 30, test circuit 80 includes a controller 32, a multiplexer 34, and a frequency measurement circuit 38. In the circuit 80, the output 41 of the PLL is input into the controller 32 which generates a feedback clock 42.

For this type of PLL, self-test should be initiated only after the 'Lock' condition is detected. When the Lock condition is detected (step 82), controller 32 enables the feedback with a 90° phase shift by applying a logic high (step 84) to the control input of multiplexer 34 to select the feedback clock 42 instead of the input clock 14. The controller 32 then waits (step 85) a sufficient number of cycles for the output frequency to settle. After the pause, the controller 32 counts PLL output cycles for 5J feedback cycles and then stores the number of cycles counted as count1 (step 86).

Next, the controller starts a new count (step 88) and changes the feedback phase shift to 0° for J cycles (step 90). At the end of the J cycles, the controller 32 again pauses (step 92) for another predetermined number of cycles, such as 4J cycles, and then stops counting and stores the final count as count2 (step 94). J is an integer whose value may be 32, for example, (J is shown as 6 in line w14 in FIG. 5 to simplify the illustration). The feedback clock 42 made is the same as (or inverted relative to) the clock 16 fed back into the phase comparator 24 within the PLL, and therefore the phase difference becomes approximately zero (or 180°), i.e the feedback clock 42 has equal (or opposite) phase to the internal feedback clock 16. However, since the normal phase difference for the Exor-type PLL is typically 90° in the center of the PLL frequency range, the output of the phase comparator 24 becomes a continuous logic low (or logic high), as shown in line w22 in FIG. 5, and the low pass filter output voltage begins to fall (or rise) as shown in line w24, which causes the output frequency of the PLL to decrease (or increase) as shown in line w20. The normal input 14 is re-enabled via the multiplexer 34 (Step 95) and a value proportional to the Loop GBW, i.e. the average change in PLL output frequency, is determined (step 96). It can be shown that the Loop GBW is proportional to the difference between the two counts, count1 and count2, multiplied by the ratio of J/N. The value proportional to the Loop GBW is compared with one or more stored values to determine whether the PLL passes or fails the test (Step 97).

For a PLL with a low value for loop GBW, J can be a large integer to ensure that sufficient frequency deviation occurs. For a PLL with a high value for loop GBW, the value of J should not be so large as to allow time for the low pass filter (LPF) output to reach a constant value. The resolution of the PLL output is equal to ¼j, so small values of J should be also be avoided. An alternative way to accommodate high values of loop GBW and a sufficiently large value for J is to feedback a clock whose phase has been shifted by some value between 0° and 90°. For example, 45° is an easily generated value in some cases. Alternatively, a constant delay can be used to provide a different phase shift, such as that provided by a combinational logic gate whose delay can be measured using other means.

Measurement of Lock Range

Figure 7:
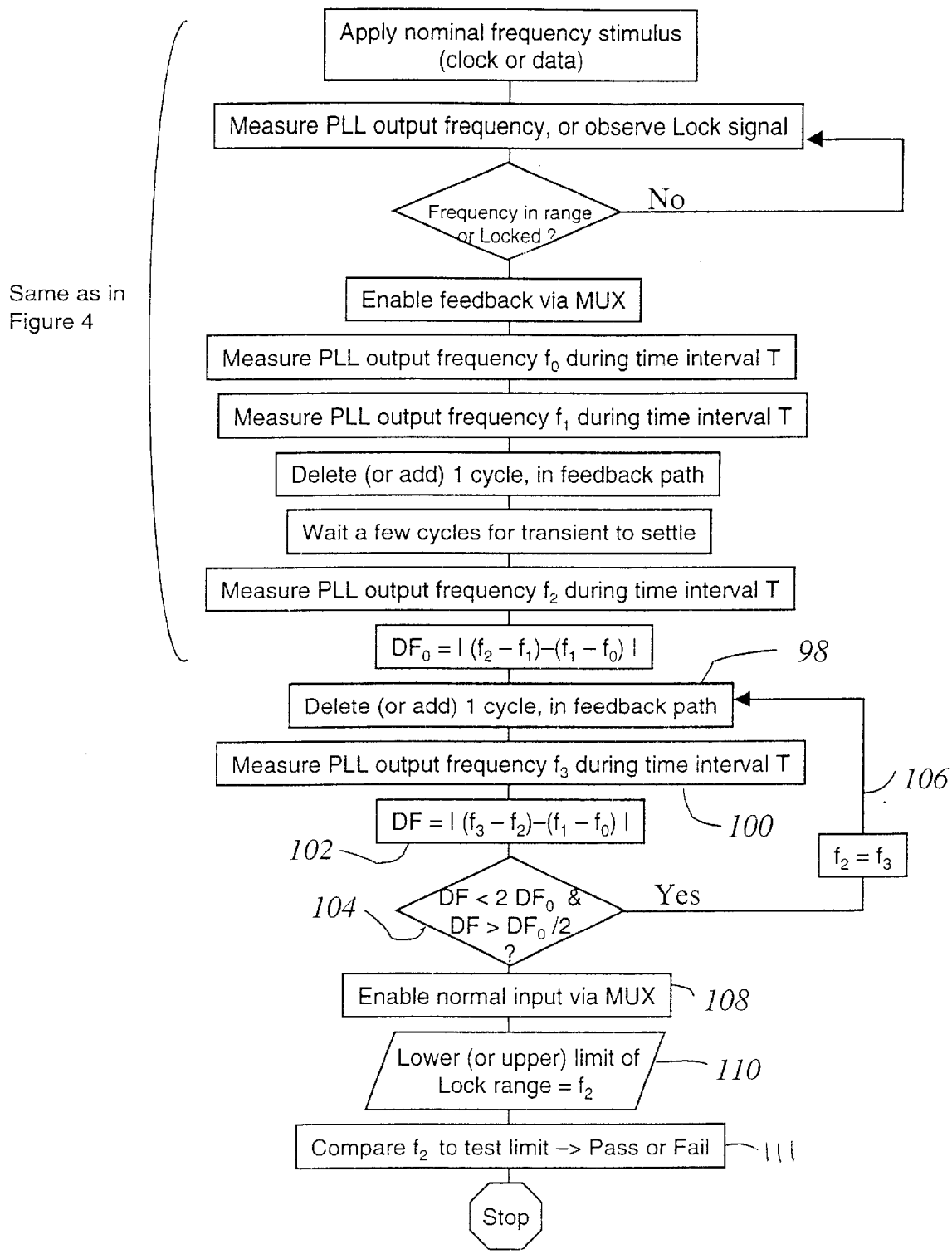
FIG. 7 is a flow chart illustrating method, according to a preferred embodiment of the present invention, of measuring the Lock Range for a Charge Pump type PLL.

Reference will now be made to the Flow Diagram in FIG. 7 which illustrates a procedure for measuring the frequency lock range of a PLL containing a charge-pump phase comparator. The circuitry described earlier with reference to FIG. 3 for measuring loop GBW can be used for lock range measurement, with modifications to controller 32 only to implement the different sequence.

Figure 4:
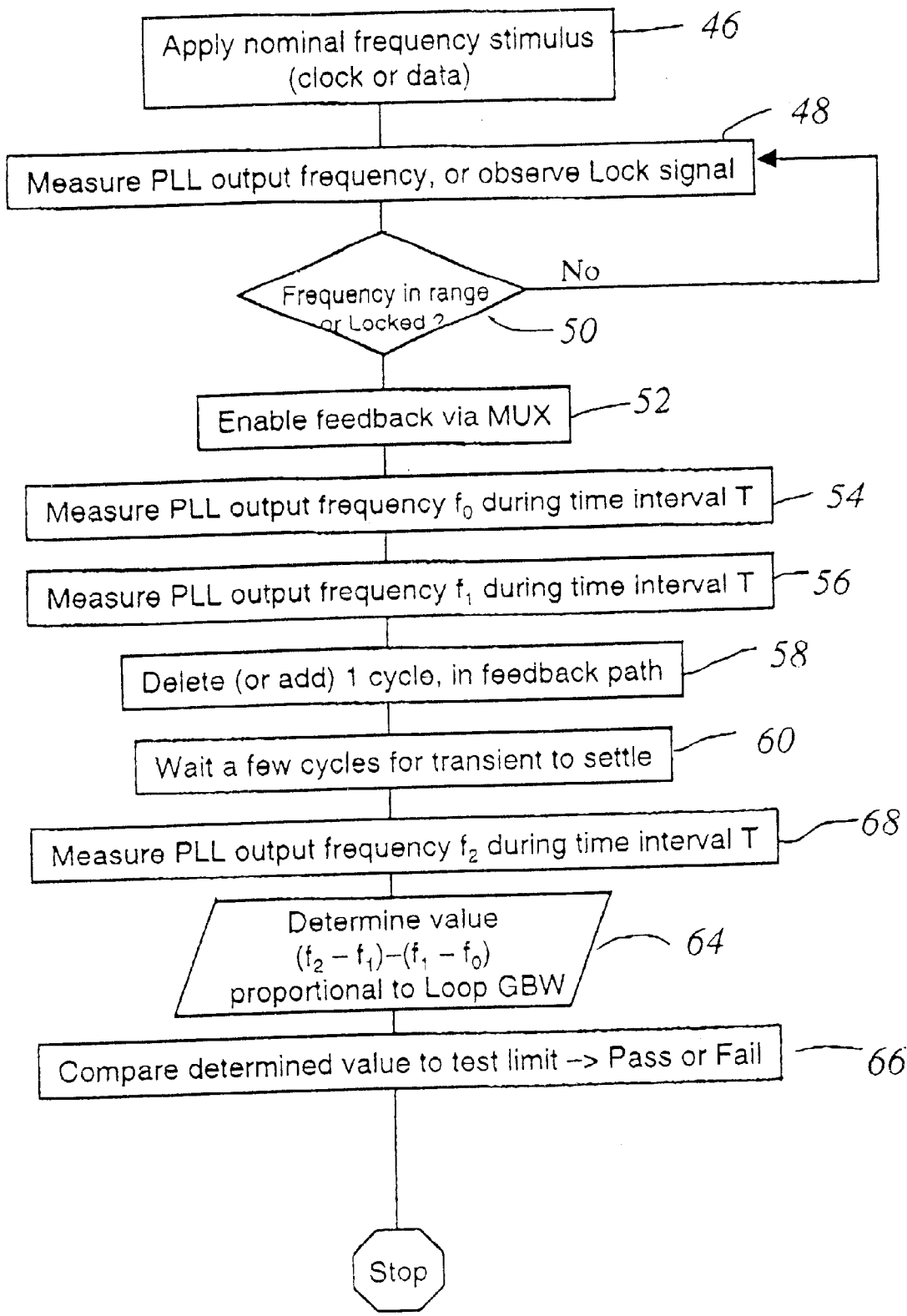
FIG. 4 is a flow chart illustrating method, according to a preferred embodiment of the present invention, of measuring the Loop Gain-Bandwidth Product for a Charge Pump type PLL.

The procedure can begin immediately after a value of $DF_0=(f_2-f_1)-(f_1-f_0)$ is determined in the Loop-GBW procedure illustrated in FIG. 4. Then, another cycle is deleted (or added) (step 98) and the PLL frequency is measured again (step 100), as $f_3$. Next, the value $DF=(f_3-f_2)-(f_1-f_0)$ is determined and compared to $DF_0$ (steps 102 and 104, respectively) If the value of DF is within some range of $DF_0$, for example within a factor of two, then the loop GBW is decreasing (or increasing) sufficiently linearly. Cycles are continually deleted (or added) (loop 106) until the value of DF is no longer within range of $DF_0$, at which time the loop GBW is assumed to be nearing saturation or a very non-linear region of operation, and hence the lock range limit has been exceeded. At this point the procedure is terminated and the normal input is enabled (step 108). The last frequency measured in the linear region s the lower (or upper) limit of the frequency lock range (step 110). The lower (or upper) limit $f_2$ is compared with one or more stored values to determine whether the PLL passes or fails the test (Step 111). If initial phase lock does not occur, the PLL fails the test.

A significant advantage of this procedure is that only a constant frequency or data rate needs to be applied to the PLL by external test equipment, which greatly simplifies the test equipment and test program, reducing test development time and cost of testing.

Measurement of Lock Range for Exor-type PLL

Figure 8:
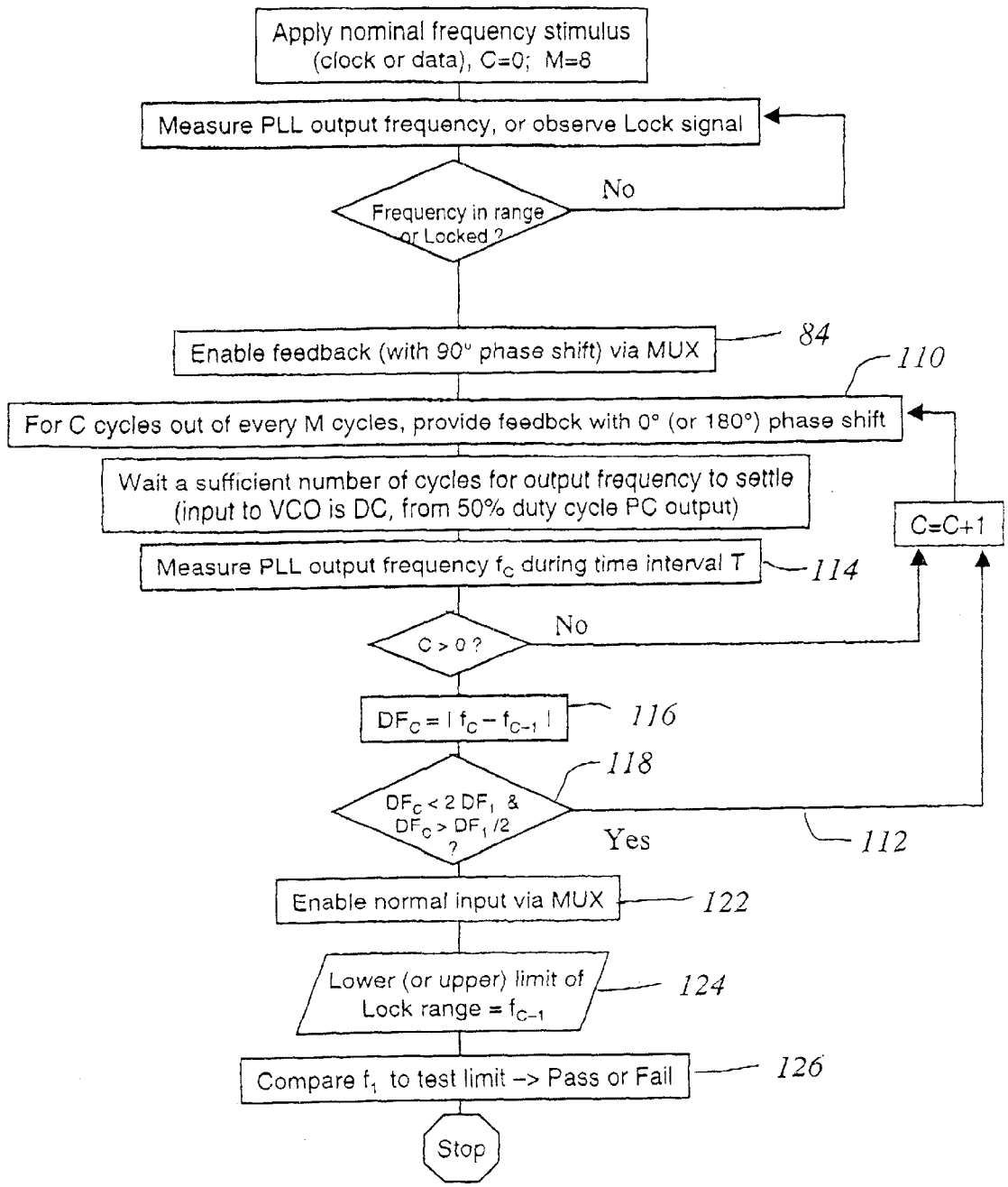
FIG. 8 is a flow chart illustrating method, according to a preferred embodiment of the present invention, of measuring the Lock Range for an Exor type PLL.

FIG. 8 is a flow chart which illustrates a procedure for measuring the frequency lock range of a PLL containing an Exor gate phase comparator. The circuitry shown in FIG. 5 described earlier for measuring loop GBW can be used for lock range measurement, with modifications to only controller 32 to implement the different sequence.

As in the loop GBW measurement, a nominal frequency clock or data 14 is applied to the PLL input, and after phase lock is achieved, the 90° phase shifted output 42 is feedback into the PLL via multiplexer 34 (Step 84), so that the duty cycle at the output of the Exor gate 29 internal to the PLL becomes 50%. A short settling time may be required for the VCO output frequency to become stable, and proportional to the 50% duty-cycle.

Next, for C cycles out of every M cycles of the feedback signal (loop 112), the phase shift is changed to 0° (or 180°) (step 110) which causes the PLL output frequency to decrease (or increase). C and M are integers, and C is increased from 0 to M−1, where M is, for example, 8. The output of the Exor gate 29 will then have an average duty cycle of 50%−100%×C/M (or 50%+100×C/M).

The frequency $f_c$ is measured (step 114) each time C is increased. The value of $DF_c=f_c-f_{c-1}$ is determined (step 116) and compared (step 118) to $DF_1=f_1-f_0$. If the value of $DF_c$ is within some range to $DF_1$, for example within a factor of two, then the loop GBW is decreasing (or increasing) sufficiently linearly. C is increased (step 120) until the value of DF is no longer within range of $DF_1$, at which time the loop GBW is assumed to be nearing saturation or a very non-linear region of operation, and hence the lock range limit has been exceeded. At this point the procedure is terminated and the normal input is enabled (step 122). The last frequency measured in the linear region is the lower (or upper) limit of the frequency lock range (step 124), i.e. the lock range is $f_{c-1}$. The lower (or upper) limit $f_1$ is compared with one or more stored values to determine whether the PLL passes or fails the test (Step 126). If initial phase lock does not occur, the PLL fails the test.

Measurement of Parameters which affect Bit Error Rate

Figure 9:
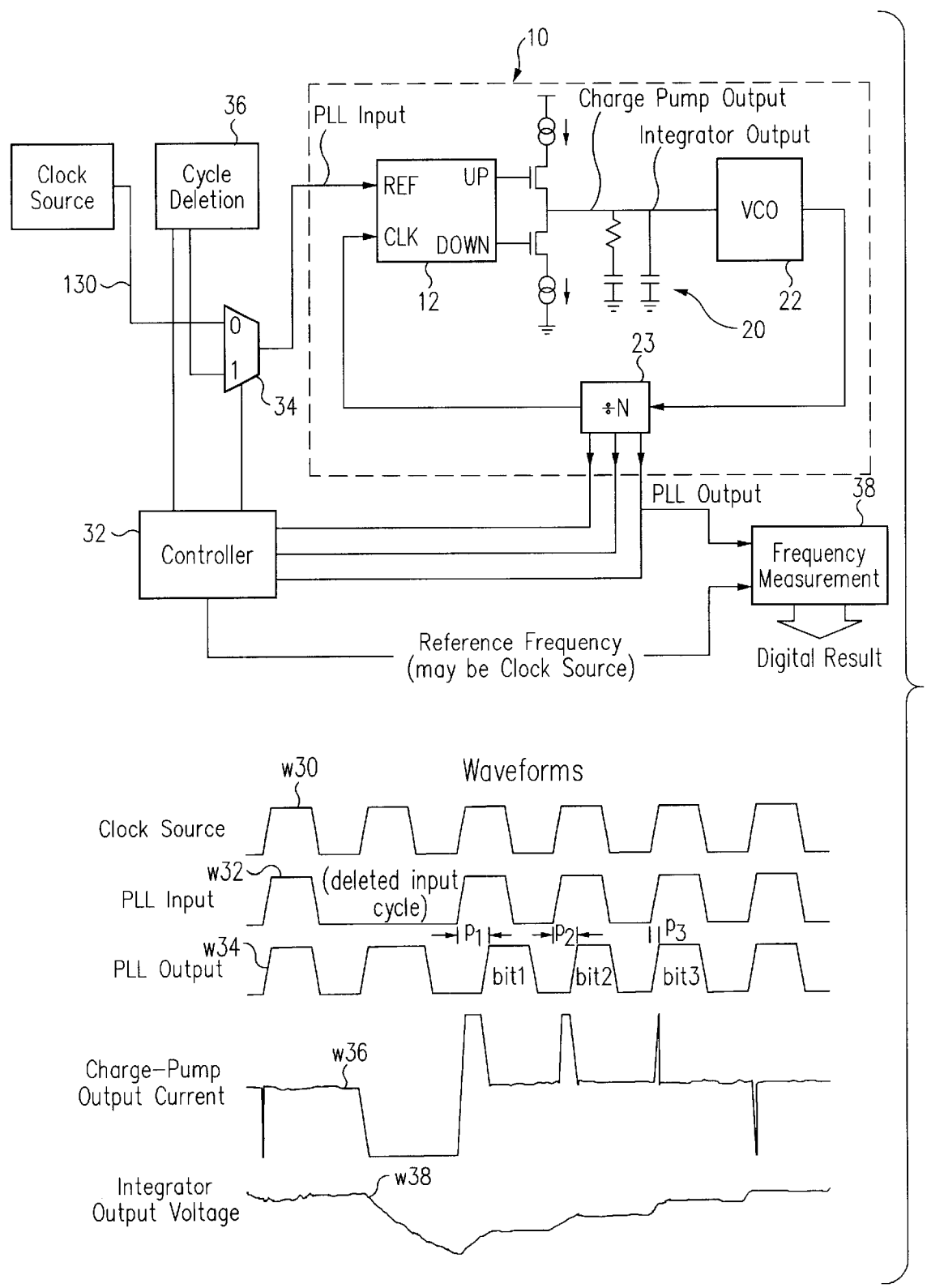
FIG. 9 diagrammatically illustrates a test circuit, according to a preferred embodiment of the present invention, for measuring Bit Error Rate and corresponding waveforms.

Using a circuit such as that shown in FIG. 9, which is similar to circuitry described for testing loop GBW of an Exor-type PLL (FIG. 5), it is possible to adjust the phase error for selected bits in the data stream. By increasing the phase error used to detect bits in a noise-free data stream until bit errors are induced, it is possible to determine how much inherent phase error and noise is present in the detection circuitry and thus to estimate the BER that would occur without any induced phase error. For a noise-free data stream, the BER is typically too small to measure economically, so the method of the present invention can save considerable time and expense.

As was demonstrated for testing loop GBW, deleting (or adding) one or more sequential clock cycles has the same effect as a step increase in phase error (see the waveforms shown in lines w30–w38 of FIG. 9), and causes the PLL to respond in a way which reduces the phase error, i.e. the integrator 20 or LPF (28 in FIG. 5) output decreases (or increases) at a rate determined by the loop GBW. As soon as the clock cycles are no longer deleted, the integrator or LPF output increases (or decreases) to its original value, but at a slower rate (line w38). This rate was measured in the loop GBW test for the Exor-type PLL in the embodiment shown in FIG. 6. The clock cycle immediately following the $J^{th}$ clock pulse deleted will have a predictable phase error, and this phase error will increase for each subsequent clock cycle as long as clock cycles are being deleted. Using this principle, precise increments in phase error can be introduced. An example process which uses this principle will now be described with reference to FIGS. 9, 10 and 14.

Figure 14:
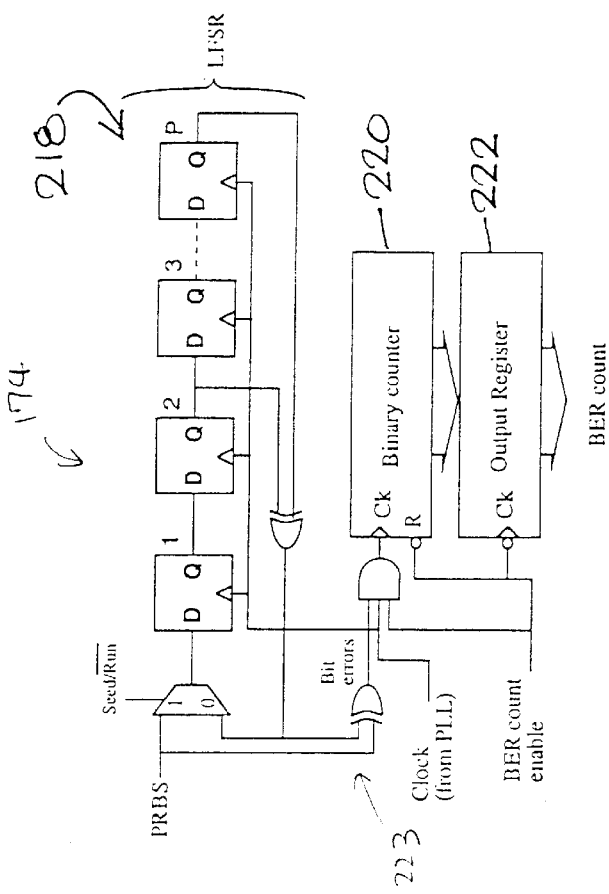
FIG. 14 diagrammatically illustrates a bit error rate counter circuit used in the phase jitter circuit of FIG. 11.

Before initiating the process, an input data stream 130 is applied as stimulus to the PLL, which is in a closed-loop mode (step 131). The input data stream may be a pseudo random bit stream (PRBS), alternating 1's and 0's, or a clock. Bit errors are detected by conventional means. For example, FIG. 14 shows a P-bit (e.g. P=8) linear feedback shift register (LFSR) 218 serially loaded with the received data, which is presumed to be temporarily error-free, and then data is fed back within the LFSR 218 which causes a correctly initiated PRBS to be continually generated for comparison with the received PRBS. Any comparisons which reveal a difference are counted by a BER counter 220. Typically, P is 8, 12, or 16, but, if the data is simple alternating 1's and 0's, then P is 1.

As indicated in more detail below, the input data stream 130 is interrupted so as to delete J cycles by the cycle deletion circuit 36. This causes the phase error of the PLL output to increase relative to the data stream. The values of J, a BER counter, and x, a subscript for each BER count, are initialized (step 132) to zero. J is the number of sequential cycles which are deleted. A process cycle counter, K, is set to 1. Controller 32 then executes loop 134 to confirm that the PLL frequency is in range or that the 'Lock' signal is present.

When the data stream is a clock or alternating 1's and 0's (which is a half speed clock), the data stream may be used to clock the circuit which deletes cycles. When the data stream is a PRBS, the PLL output clock may be used to clock the circuit which deletes (or adds) cycles; in this case, as phase error increases, non-integer number of cycles (bits) will be deleted.

Figure 10:
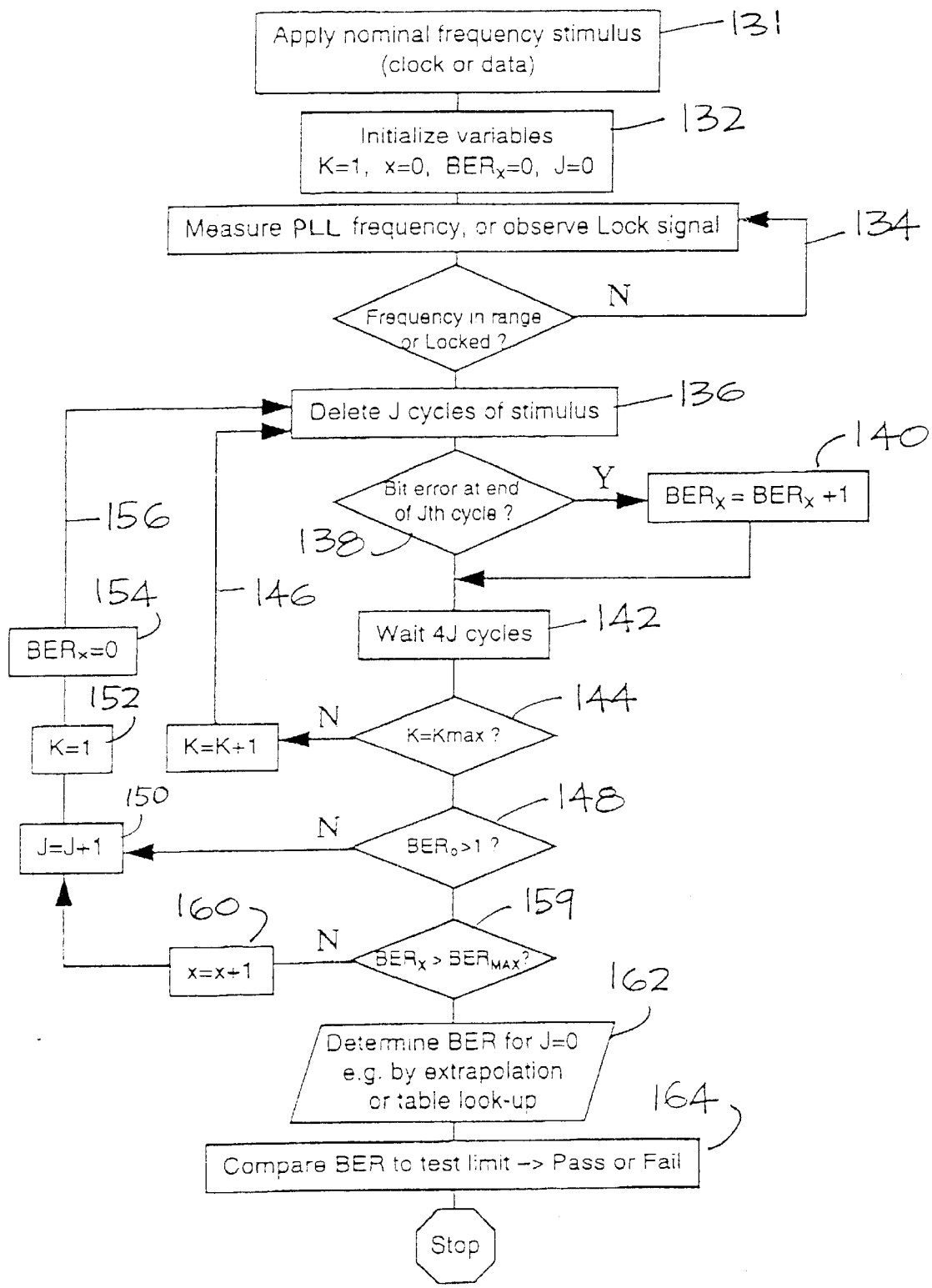
FIG. 10 is a flow chart illustrating method, according to a preferred embodiment of the present invention, of measuring the Bit Error Rate of a PLL.

With particular reference to FIG. 10, the process involves the following sequence of steps:

First, J data stream cycles are deleted (step 136), and, if there is a bit error at the end of the $J^{th}$ cycle (step 138), the BER counter is incremented (step 140). This step is followed by a pause (step 142) of approximately 4J clock cycles, during which no cycle deletion occurs and phase lock is regained. If the number of sequences K has not reached its maximum preset value (step 144), $K_{max}$ which may be 1,000 for example, loop 146, comprising steps 136, 138 and 142, is repeated.

When K reaches $K_{max}$, $BER_0$ is checked to determine if it exceeds a predetermined value (step 148), such as 1. If it does not, J is incremented (step 150), K is reset to 1 (step 152), and $BER_x$ is set to zero (step 154). A loop 156, comprising steps 136, 138, 142,144 and 148, is repeated.

If at step 148, $BER_0$ is found to exceed the predetermined value, the value of the BER counter output is checked to determine whether it has reached a maximum preset $BER_{max}$ (step 159) and, if it has not, x is incremented at 160, and then loop 156 is repeated. If $BER_x$ has reached its maximum, the process is terminated at 162 where the BER for J=0 is determined. The BER can be estimated by appropriately extrapolating the values of BER ($BER_0$, $BER_1$, . . . ) versus J ($J_0$, $J_1$, . . . ) to the point where J=0 using any of various mathematical relationships that have been published relating phase error to BER. Alternatively, the BER values can be compared to BER values measured in several manufactured units of the IC whose true BER for J=0 and whose BER for other values of J is known. For example, if the in-system BER for one unit of the IC is measured as $BER_a$, and the BER for another unit is $BER_b$, and then the values of BER versus J for each unit are measured, the relationship can then be calculated between in-system BER and the extrapolated value of BER versus J. The determined BER is compared with one or more stored values to determine whether the PLL passes or fails the test (Step 164).

Many variations on this method are possible. For example, less than a full pulse can be deleted each time, as previously described for loop GBW measurement. This allows smaller increments in phase error, but requires N>2 to ensure that sufficient clock edges are available to create a synchronous phase delay.

Further, a phase error, C clock cycles after pulse deletion (or addition) ceases, can be used—this phase error will decrease more gradually than when cycles were being deleted, and thus allow smaller phase steps. C is increased each time that loop 156 is repeated, instead of increasing J.

Measurement of Jitter and Phase Error

Another important parameter of a PLL is the output clock phase jitter relative to an ideal clock. In the method described herein, jitter is measured relative to the input clock or data, either of which is assumed to be jitter free.

Figure 11:
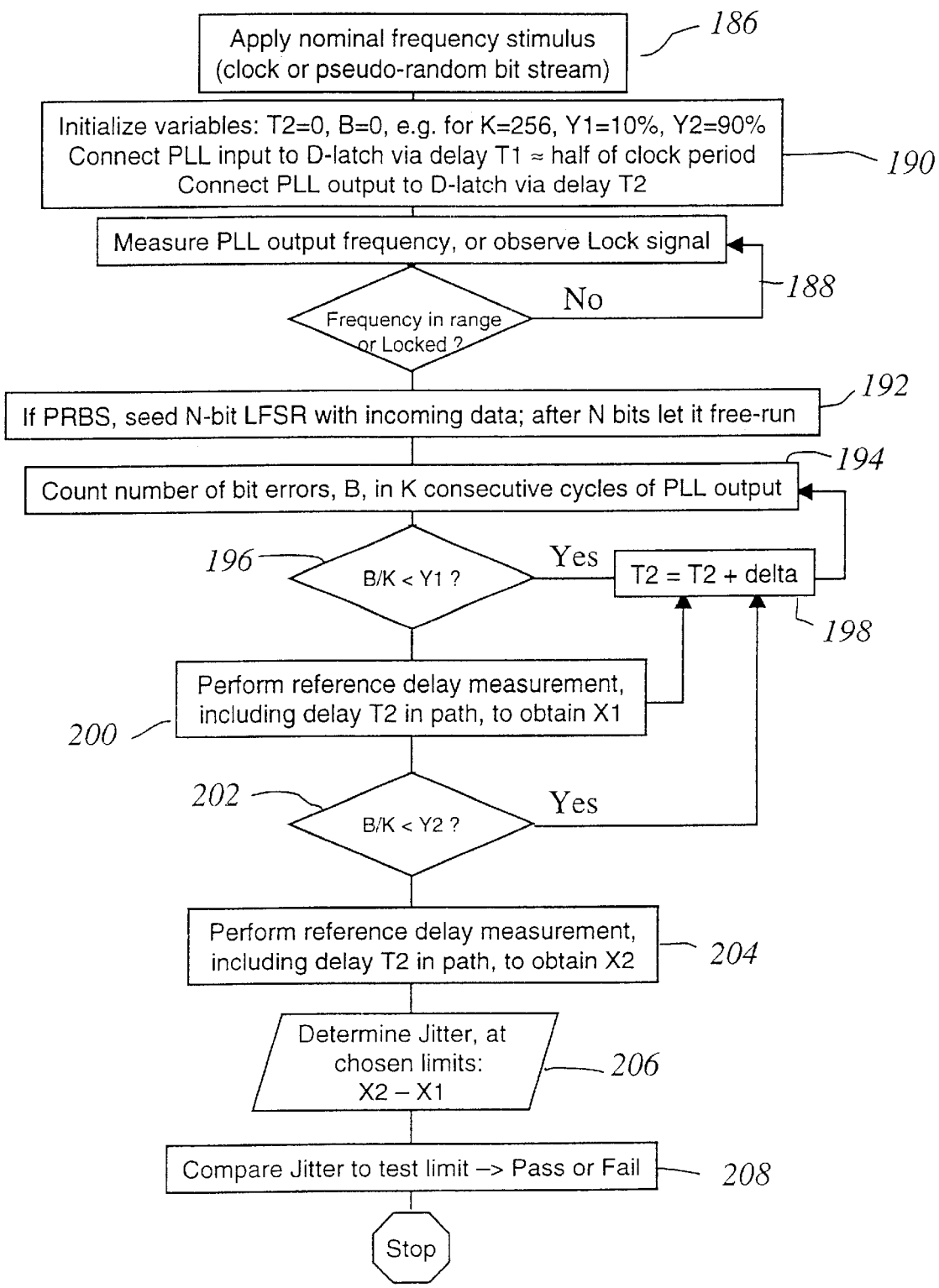
FIG. 11 diagrammatically illustrates a test circuit, according to a preferred embodiment of the present invention, for measuring phase jitter and corresponding waveforms.
Figure 12:
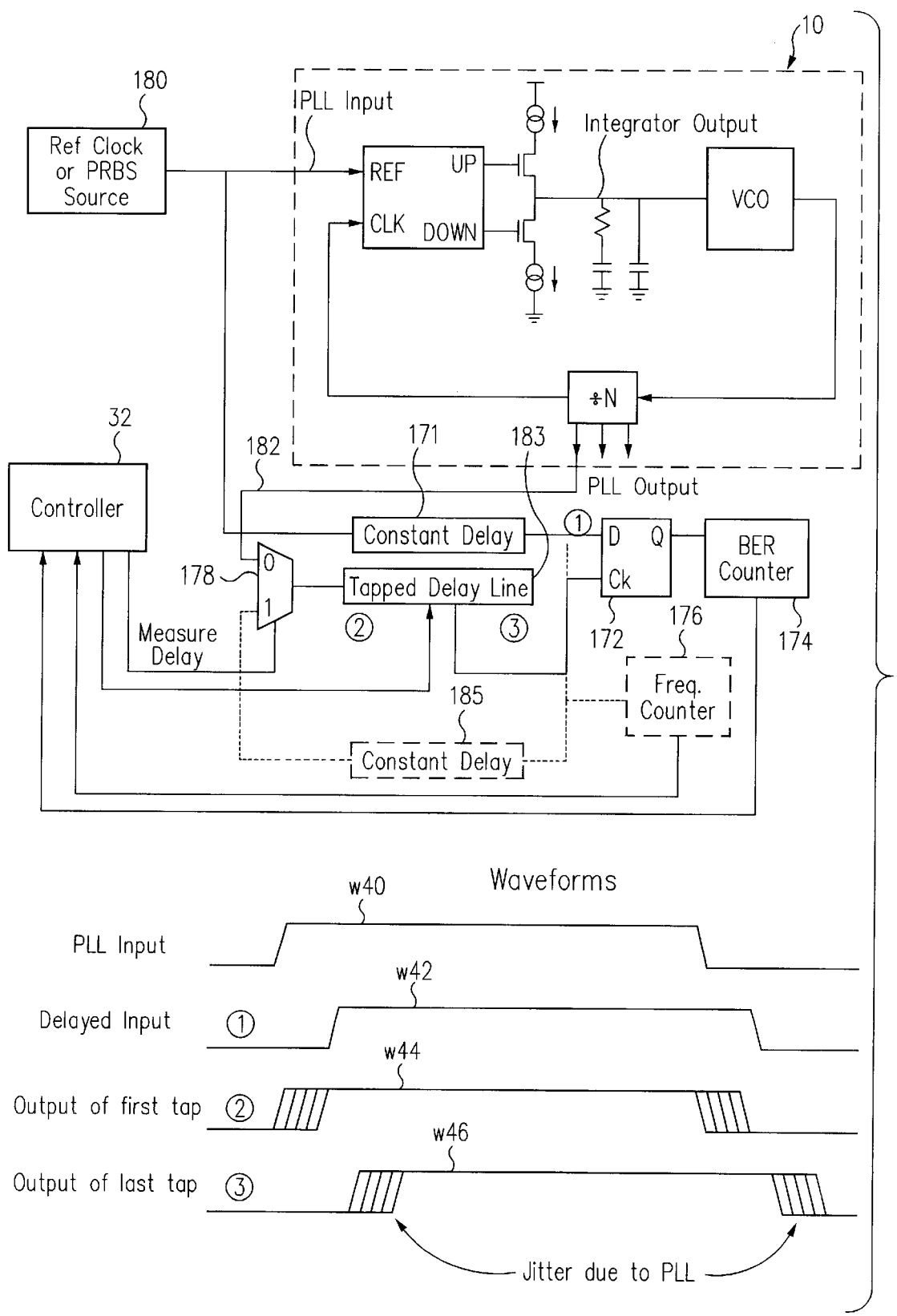
FIG. 12, located adjacent

In accordance with the method of the present invention, Jitter is measured by introducing a progressively increasing delay into the PLL output while monitoring the difference between the PLL input signal and the delayed PLL output signal for incorrect bits and determining (a) the value of the delay at which detected bits cease to be continuously correct and (b) the value of the delay at which a predetermined number of detected bits are incorrect. The difference between the two values is equal to the peak-to-peak Jitter. FIG. 12 illustrates a circuit 170 which can be used to measure Jitter and FIG. 11 is a flow diagram illustrating a procedure for measuring Jitter.

With reference to FIG. 12, circuit 170 includes controller 32, a delay mechanism 171, a latch (or D-type flip-flop) 172, a BER counter 174, a frequency counter 176 and a multiplexer 178. Delay mechanism 171 may be in the form of a series of non-inverting logic gates such as is shown at 216 in FIG. 13. The normal input 180 to the PLL 10 is a reference clock, a PRBS or alternating 1's and 0's which is also input to the controller 32 and to the input of delay mechanism 171.

The outputs of counters 174 and 176 are fed back to the controller 32, as shown. The output 182 of the PLL is also fed back to an input of multiplexer 178, the output of which is applied to the input of a tapped delay mechanism 183 the output of which is input to the clock input of latch 172. Tapped delay mechanism 183, illustrated in FIG. 13 and described later, is controlled by controller 32 and provides a delay T2.

Delay mechanism 171 introduces a constant delay T1 relative to the PLL input signal 184 and a delayed output data stream ① is delivered to the data input of latch 172.

The latch 172 latches the level of the T1-delayed signal, after the delay T2, whenever the PLL output signal has a rising (or falling) transition. The output of the latch is connected to BER counter 174.

Figure 11A:
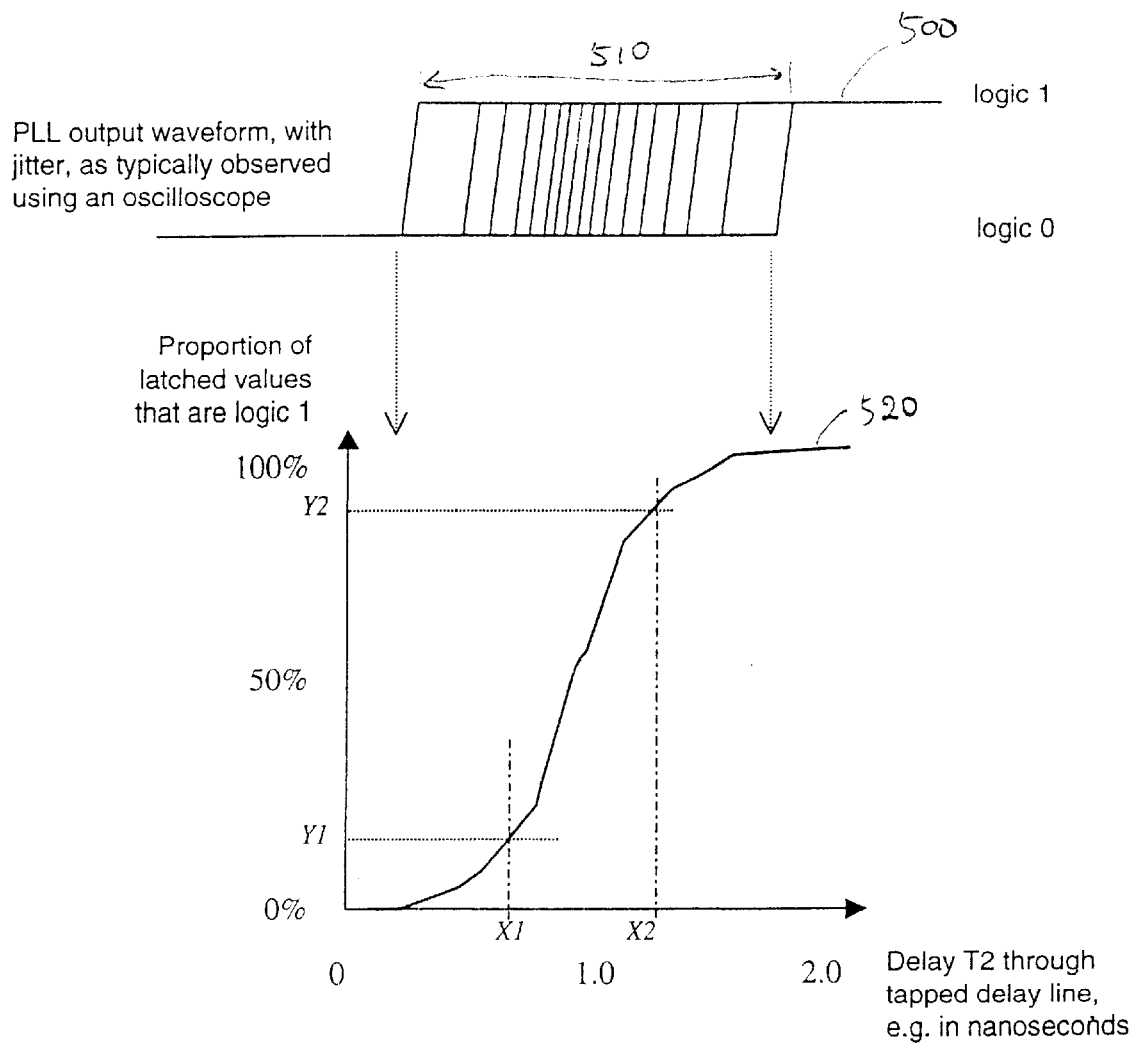
FIG. 11a is a graph for describing jitter at output of a PLL.

FIG. 11a shows an example of the PLL output waveform 500 with jitter 510, as typically observed using an oscilloscope, and a plot 520 of its cumulative distribution function (CDF). The plot 520 denotes the relation between the delay T2 through tapped delay line 183 and the probability or proportion of latched values that are logic 1. At two different points in the delay time, X1 and X2, the proportion of latched values that are logic 1 is measured as Y1 and Y2, respectively.

Referring to FIG. 11, initially, a nominal frequency stimulus (line w40) is applied to the PLL (step 186) and the PLL is permitted to achieve a 'lock' condition (loop 188). Concurrently, a number of variables are initialized as shown at step 190 and the delayed output data stream ① (line w42) with delay T1 is connected to the data input of latch 172. In step 192, if the stimulus is a PRBS, the N-bit LFSR used by the BER counter 174 is synchronized to the PRBS by serially latching in any N error-free bits and then allowing the LFSR to free run: it will generate an error-free PRBS. BER counter 174 then counts the number of latched levels or bit errors, B, in K consecutive cycles of the PLL output (step 194) and outputs the results to controller 32. The controller 32 then determines whether the average value B/K is less than a predetermined value, Y1, (step 196) and, if so, adjusts (e.g. increases) the delay T2 by a value, delta, (step 198) and then repeats steps 194 and 196. If B/K is greater than Y1, controller 32 performs a reference delay measurement including the delay T2 in the path to obtain X1 (step 200). The controller 32 then determines at step 202 whether B/K is less than another predetermined value, Y2, and, if so, adjusts (e.g. increases) the delay T2 by a value, delta, at step 198 and then repeats steps 194 and 196. If B/K exceeds the value Y2 at step 202, the controller 32 performs a reference delay measurement including the delay T2 in the path to obtain X2 at step 204. With the values of X1 and X2, it is possible to determine Jitter at step 206 by determining the difference between the two values, X1 and X2. The Jitter can be compared at step 208 against some predetermined value to determine whether the PLL passes or fails.

The sequence, just described, is a linear search for the time range limits of the jitter. Other searches, such as a binary search, could be used. The delay difference obtained can be measured using any of several schemes, for example, by inserting the delay into an oscillating loop or a ring oscillator, and measuring the resulting increase in an oscillation period: FIG. 12 shows this circuitry in dashed outline as an example. When the stimulus bit stream 184 is alternating 1's and 0's, Y1 will be 0% of the number of bits counted. When the stimulus bit stream 184 is a PRBS, Y1 will be some predictable number greater than 0%, since many adjacent bits in the PRBS will be identical and hence a one-bit delay will not always cause an error. The value of Y1 for a particular PRBS is equal to the number of bit errors that would result if the PRBS were compared to itself delayed by one bit interval. To insert delay into an oscillating loop, a circuit such as that shown using dashed lines in FIG. 12 is used. An offset delay 171 is provided to allow jitter measurement in the presence of zero or negative inherent phase error.

Almost any means can be used to provide incremental delay T2 for the tapped delay line 183, because the delay T2 is always measured for the tap selected. For example, the first logic gate in the series chain of gates can be a multiplexer which has slightly different inherent delays for each of its inputs, so that delay increments less than the delay of the fastest logic gate available in the technology are selectable by selecting different inputs of this multiplexer.

In the embodiment shown in FIG. 12, the delay T1 inserted into the PLL input signal is constant, and the delay T2 inserted into the PLL output signal is varied and measured. However, the delay T2 may be constant, and the delay T1 may be varied and measured to determine the phase jitter. Also, both delays T1 and T2 may be varied until the number of latched levels or bits whose value is correct is not constant, and then only delay T1 or delay T2 is varied and measured to determine the phase jitter.

The definition of "continuous", as used in the preceding description can be adjusted by the circuit designer. For example, continuous could mean a duration of 1024 bits. The duration should be an integer multiple of the PRBS length. Lower numbers allow faster tests but may not detect a low frequency jitter.

Another measure of jitter is the time range in which X% of the jitter occurs. For example, if X=80, then the jitter delay range would be from 10% to 90%, corresponding to a range from 102 bits in error to 918 bits in error out of 1024 bits. To accomplish this measurement, each time the delay T2 is increased, the number of errored bits is compared to a programmable limit or shifted off-chip. If X=68%, the delay range measured will be approximately equal to twice the value of the standard deviation (also referred to as the sigma, RMS, or root mean square) of the jitter, which is a common statistical parameter used in describing the amount of jitter.

The mean value of the jitter is the mean phase error and it can be measured by determining the tap for which the output of latch 172 is correct 50% of the time, when the PLL stimulus is a clock. In general, the tap which corresponds to the mean phase error will be the tap which results in a correct output U% of the time, where U is the mean of the minimum and maximum expected values. For example, for a clock stimulus, the minimum expected value for the proportion of correct values is 0%, and the maximum is 100%; thus, the mean phase error occurs for the tap which results in 50% correctly latched values. For a PRBS, the minimum expected value might be 20%, while the maximum expected value would be 100%. In this case the mean phase error occurs for the tap which results in 60% of the latched values being correct. The constant delay T1 of the constant delay circuit 171 is subtracted from the delay T2 of the tapped delay line 183 to obtain the mean phase error (which can be negative). This can be done by measuring the delay T2 using the same means as is used to measure It is preferable to measure jitter for a pseudo-random bit sequence (PRBS) since it is more representative of typical data. The data stream is generated using an LFSR with P bits, on-chip or off-chip, filtered by a transmitter filter and a receiver filter and then sampled using latch 172 (or D-type flip-flop) which is clocked by the PLL output. The output of the latch is compared against the correct value to check for bit errors. The correct value can be obtained typically using a second P-bit LFSR which is the same as the transmit LFSR but is bit-synchronized to the received data stream. As previously mentioned, bit synchronizing is accomplished by loading in any series of P bits which are error free.

Figure 13:
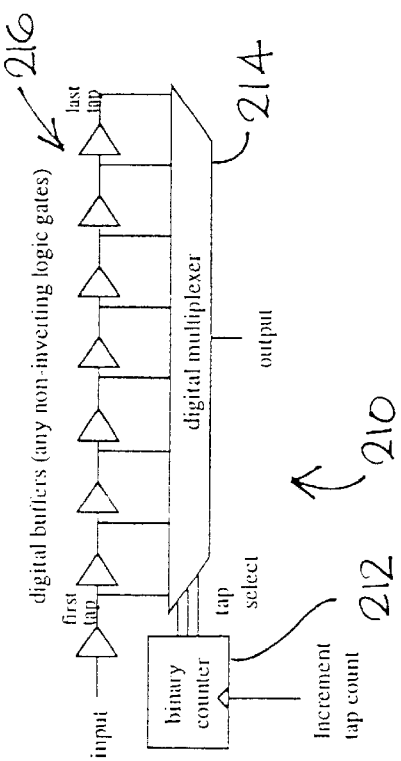
FIG. 13 diagrammatically illustrates a tapped delay line circuit used in the phase jitter measuring circuit of FIG. 11.

FIG. 13 illustrates an example of the tapped delay line 210 which includes a binary counter 212, a multiplexer 214 and a series of taps 216. In this example, the series of taps 216 comprises non-inverting logic gates, but it may comprise inverting logic gates. The input signal is applied to the first tap and the desired tap count is applied to the counter 212. The output of the multiplexer 214 is a signal having the desired delay.

FIG. 14 illustrates an example of a BER counter 174 which includes a linear feedback shift register 218, a binary counter 220, an output register 222 and combinational logic 223.

Figure 15:
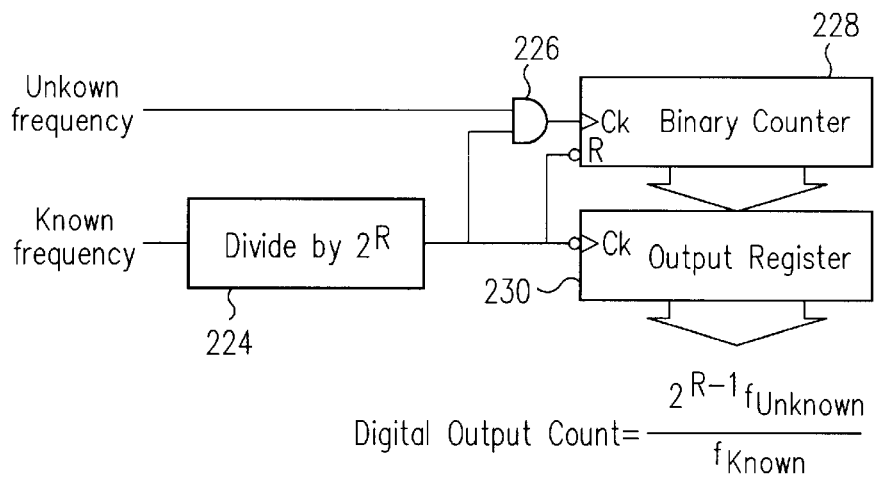
FIG. 15 diagrammatically illustrates a Frequency Measurement Logic Circuit.

FIG. 15 illustrates the frequency measurement circuit 38 for measuring frequency. The circuit includes a $2^R$ divider 224, which receives a known frequency, an AND gate 226 which receives the frequency to be measured and the output of the divider 224, a binary counter 228 which receives the output of the AND gate 226 and of the divider 224, and an output register 230 which receives the output of the counter 228 and of the divider 224 and outputs a digital value proportional to the (unknown) frequency from the PLL.

Figure 16:
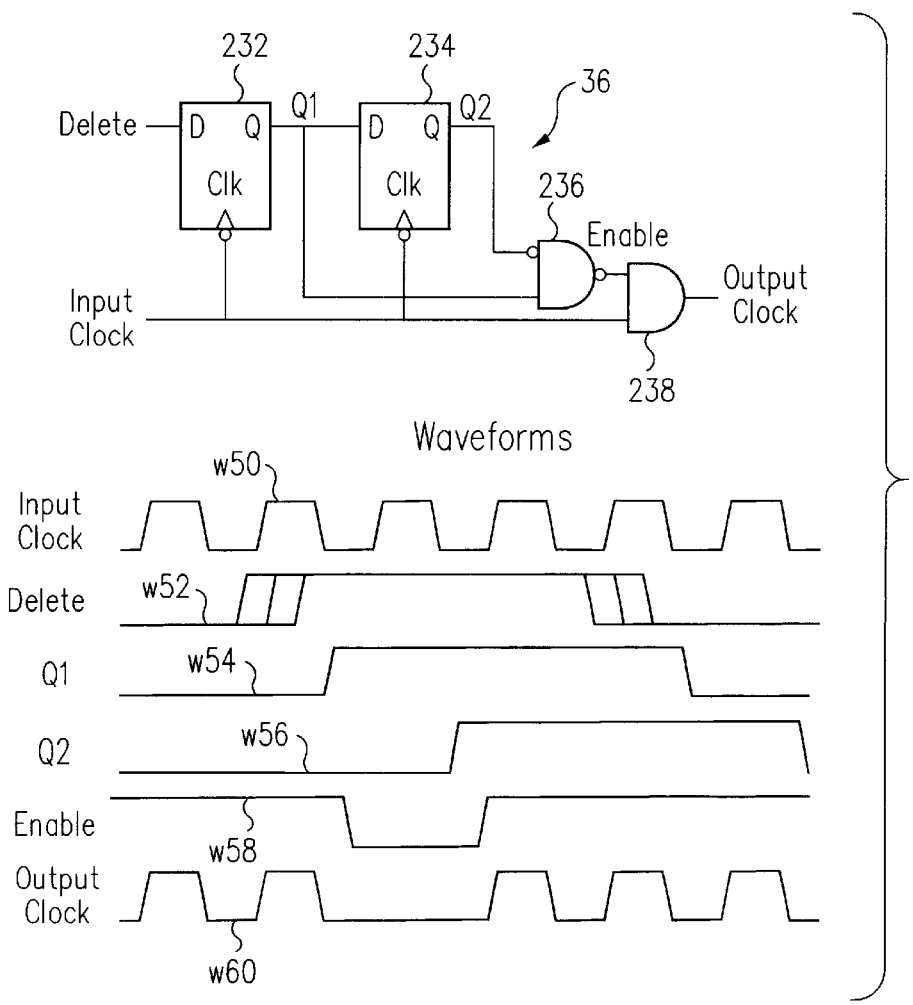
FIG. 16 diagrammatically illustrates a Cycle Deletion circuit for eliminating a single cycle from a clock signal and corresponding waveforms.

FIG. 16 illustrates a cycle deletion circuit 36 which can be used for cycle elimination. The circuit includes two D-type latches 232 and 234 and combinational logic, including a pair of AND gates 236 and 238. The input clock (line w50) is applied to AND gate 238 which produces a new output clock signal (line w60). When a 'delete' input (line w52) is applied to latch 232, the circuit substitutes a logic low for a logic high in the input clock signal (lines w50-w60).

FIG. 17 illustrates a circuit 240 which is adapted to perform either cycle deletion or cycle addition. The circuit 240 includes three D-type latches 242, 244 and 246 and combinational logic 248. The waveforms of the circuit 240 are shown in lines w61–w74. It is believed that the operation of the circuit will be apparent to a person skilled in this art and, accordingly, the operation is not be described herein.

It will be seen that the foregoing has described circuitry and processes for measuring various parameters of PLLs, including loop GBW, lock range, BER, Jitter, and phase offset, without connecting to the internal components of the PLL. While individual circuits have been described and illustrate for determining these parameters, it will be understood that the individual circuits can and normally would be combined into a single BIST circuit capable of performing all of the required measurements.

It will also be understood that the present invention is not limited to the specific circuits described and illustrated and that various other modifications and alterations may be made thereto by persons skilled in the art without departing from the spirit of the invention defined in the appended claims.

We claim:

1. A circuit for measuring a phase locked loop (PLL) having an input, an output and a lock range, the circuit comprising:

means for providing a stimulus signal whose frequency is within the lock range of the PLL;

means for deriving one or more alternative signals from a feedback signal path of the PLL;

means for temporarily connecting said one or more alternative signals to the input of the PLL;

means for measuring an output frequency of the PLL; and means, responsive to a condition in which the PLL output frequency is within the lock range, for determining a parameter proportional to a change in the PLL output frequency caused by temporarily applying any of said alternative signals to the input of the PLL.

2. A circuit according to claim 1, wherein said means for deriving being operable to derive an alternative signal which is equal in frequency and phase to an internal feedback to a phase comparator in the PLL, further including means for replacing a selected number of cycles of a signal derived from the feedback signal path by a logic high or logic low, and after replacing these cycles, said measuring means being operable to measure a resulting average output frequency, the change in frequency being proportional to a loop gain-bandwidth for the PLL and to the number of cycles replaced.

3. A circuit according to claim 1, wherein said means for deriving being operable to derive an alternative signal which is equal in frequency and phase to an internal feedback signal applied to a phase comparator in the PLL, but having a selected number of cycles replaced by cycles having a phase offset, and, after replacing these cycles, said means for measuring being operable to measure a resulting average output frequency during a time interval, the change in frequency being proportional to a loop gain-bandwidth for the PLL, to the number of cycles replaced, and to said phase offset.

4. A circuit according to claim 3, further including means for comparing the resulting parameter with one or more stored values to determine whether the PLL passes or fails.

5. A circuit according to claim 1, wherein said means for deriving being operable to derive an alternative signal which is equal in frequency and phase to an internal feedback to a phase comparator in the PLL, but having a selected number of cycles replaced by a signal having a phase offset relative to the internal feedback signal, and, after replacing these cycles, said measuring means being operable to measure a resulting average output frequency, the change in frequency will be proportional to a loop gain-bandwidth for the PLL and to the number of cycles replaced.

6. A circuit according to claim 1, wherein said means for deriving being operable to derive an alternative signal which is equal in frequency but has equal or opposite phase to the internal feedback to a phase comparator in the PLL for a selected number of cycles of the signal; said measuring means being operable to measure the output frequency during these cycles and during a time interval afterwards; the change in average frequency relative to the frequency of the stimulus signal being proportional to a loop gain-bandwidth for the PLL and to the number of cycles replaced.

7. A circuit according to claim 1, wherein said means for deriving being operable to derive an alternative signal that is equal in frequency but has a phase offset relative to the internal feedback to a phase comparator in the PLL for a selected number of cycles of the signal; said measuring means being operable to measure the output frequency during these cycles and during a time interval afterwards; the change in average frequency relative to the frequency of the stimulus signal being proportional to a loop gain-bandwidth for the PLL, to the number of cycles replaced, and to said phase offset.

8. A circuit according to claim 3, further including means for determining the change in frequency caused by the, alternative signal without any replaced cycles for a time period equal to the time period for frequency measurement when cycles are replaced, and subtracting the frequency change thus measured from the frequency change measured when cycles are replaced, to account for any error introduced by the circuit.

9. A circuit according to claim 8, further including means for comparing the resulting subtracted value with one or more stored values to determine whether the PLL passes or fails.

10. A circuit according to claim 1, wherein said stimulus signal is data which is meaningful information, random, or pseudo random.

11. A circuit according to claim 1, further including means for determining the frequency lock range when connected to a maximum required input frequency, said means for determining connecting one of said alternative signals, periodically deleting cycles and measuring PLL output frequency until a minimum output frequency is measured, and determining that the PLL fails when a required minimum output frequency is not achieved.

12. A circuit according to claim 1, further including means for determining the frequency lock range when connected to a minimum required input frequency, said means for determining connecting one of said alternative signals, periodically connecting another of said alternative signals of higher frequency, and measuring PLL output frequency until a maximum output frequency is measured; and determining that the PLL fails when the required maximum output frequency is not measured.

13. A circuit according to claim 1, further including means for determining the frequency lock range when connected to a stimulus signal with any frequency within the lock range of the PLL, said means for determining connecting one of said alternative signals, periodically deleting cycles and measuring PLL output frequency until a minimum output frequency is measured, stop deleting cycles, periodically adding pulses and measuring PLL output frequency until a maximum output frequency is measured, and determining that the PLL fails when the required maximum or minimum output frequency is not measured.

14. A circuit according to claim 1, further including means for determining a lock range when connected to a nominal input frequency, said means for determining connecting one of said alternative signals which has a negative phase offset, measuring PLL output frequency until a minimum output frequency is measured, connecting the nominal input frequency, connecting an alternative signal which has a positive phase offset, measuring PLL output frequency until a maximum output frequency is achieved, and determining that the PLL fails when the required maximum or minimum output frequency is not measured.

15. A circuit according to claim 1, further including means for automatically initiating a test, in test mode, as soon as phase-lock is detected by conventional means.

16. A circuit according to claim 1, further including means for automatically initiating a test, in test mode, as soon as the PLL output frequency is within a specified range of input frequency, as determined by the means for measuring frequency.

17. A method of measuring a phase locked loop (PLL) using a circuit according to claim 1, comprising:

testing a lock range by providing a nominal input frequency and waiting until the PLL locks;

connecting one of said alternative signals which has equal frequency and a 90° shifted phase relative to said nominal input frequency;

out of every M cycles, substituting C cycles which have a phase shift of 0° or 180°, where C is an integer between 0 and M-1;

recording the change in frequency each time, until the change becomes too little or too much relative to a predetermined value; and measuring the output frequency of the PLL, the output frequency being approximately equal to a lower or upper limit of the frequency lock range for the PLL.

18. A circuit for measuring a PLL having an input, an output and a lock range, the circuit comprising:

means for providing a stimulus signal whose frequency is within the lock range of the PLL;

means for connecting a delay T1 to the stimulus signal of the PLL input;

means for latching the level of the T1-delayed signal, after a programmable delay T2, whenever the PLL output signal has a transition;

wherein phase jitter, defined as a time interval between times X1 and X2 at which cumulative probability of a signal transition has probabilities Y1 and Y2, respectively, is measured as follows:

the delay T1 is connected to the stimulus signal of the PLL input;

the output of the PLL becomes phase-locked to the stimulus signal;

the delay T2 is adjusted using an algorithmic search routine, until the number of correct latched levels divided by the total number of latched levels, in a time interval T, is equal to Y1;

the value of T2 is measured, using said means for measuring changes in T2;

the delay T2 is adjusted using an algorithmic search routine, until the number of correct latched levels divided by the total number of latched levels, in a time interval T, is equal to Y2;

the amount by which delay T2 increased is measured, using said means for measuring changes in T2; this amount is approximately equal to X2−X1 which is the phase jitter.

19. A circuit according to claim 18, also including means for comparing the resulting measured amount with one or more stored values; where the measured amount is compared with the stored values to determine whether the PLL passes or fails.

20. A circuit according to claim 18, wherein the means for measuring the amount that the delay T2 changes comprises a ring oscillator for which T2 is temporarily part of the ring and whose change in oscillation period is equal to the change in T2.

21. A circuit according to claim 20, further including means for comparing the resulting measured amount with one or more stored values to determine whether the PLL passes or fails.

22. A circuit according to claim 18, wherein the programmable delay T2 comprises a series chain of logic gates, the input to the first of which is connected to the signal to be delayed, and a multiplexer selects any number of the logic gates in series; the output of the multiplexer being the delayed signal.

23. A circuit according to claim 22, wherein the first logic gate of the series chain of logic gates is a multiplexer which has slightly different inherent delays for each of its inputs, so that delay increments less than the delay of the fastest logic gate available in the technology are selectable by selecting different inputs of this multiplexer.

24. A circuit according to claim 18, wherein the time interval T is equal to a number of periods of the stimulus signal or the PLL output signal, and is counted by a digital counter.

25. A circuit according to claim 18, wherein a mean phase error is determined by adjusting the delay T2 using an algorithmic search routine until the number of correct latched levels divided by the total number of latched levels, in the time interval T, is equal to the average of the maximum and minimum possible values; measuring the delay T2 using said means of measuring changes in T2; measuring the delay T1 using the same means; the mean phase error is approximately equal to T2−T1.

26. A circuit according to claim 25, further including means for comparing the resulting mean phase error with one or more stored values; where the mean phase error is compared with the stored values to determine whether the PLL passes or fails.

27. A circuit according to claim 18, wherein said stimulus signal is data which is meaningful information, random, or pseudo random.

28. A circuit according to claim 18, wherein delay T1 is varied and measured instead of delay T2, and delay T2 is constant.

29. A circuit according to claim 18, wherein either delay T1 or delay T2 is varied until the number of latched levels whose value is correct is not constant, and then only delay T1 or delay T2 is varied and measured to determine the phase jitter.

30. A circuit for testing a PLL, the circuit comprising:

means for providing a stimulus signal whose frequency is within the lock range of the PLL;

means for replacing one or more consecutive data bits or clock cycles of the stimulus signal with a logic value;

means for measuring the bit errors by comparing an expected value with a latched value of the stimulus;

wherein, after the PLL output is phase-locked to the stimulus;

J bits or cycles of the signal are replaced by the logic value, causing a phase shift at the output of the PLL, and after these bits or cycles the value of said stimulus signal is latched C bits or cycles after the replacement has ceased;

time elapses until phase-lock is re-gained;

J bits or cycles are again replaced by the logic value, and again the stimulus value is latched C bits or cycles later;

repeating this procedure K times;

recording the total number of times that an incorrect value was latched within the K latched values of the BER for the specific value of J;

incrementing J and repeating the procedure record another BER;

incrementing the value of J until the BER exceeds some pre-set maximum value; and determining the BER for J=0 having no induced phase error by extrapolating from non-zero values of BER obtained with non-zero values of J.

31. A circuit according to claim 30, further including means for comparing the resulting measurement value with one or more stored values; where the output result is compared with the stored values to determine whether the PLL passes or fails the test.

32. A method of measuring a phase locked loop (PLL) having an input, an output, and a lock range, said method comprising the steps of:

applying a stimulus signal whose frequency is within the lock range of the PLL to said input;

deriving alternative signals from a feedback signal path of the PLL;

temporarily connecting or comparing any of said alternative signals to the input of the PLL, measuring the output frequency of the PLL or of the comparison while connecting or comparing each of said alternative signals; and determining one or more PLL parameters from the change in said output frequency or in a delay used to cause said change in output frequency.

33. A method according to claim 32, further including comparing each resulting parameter with one or more respective stored values to determine whether the PLL passes or fails the test.

34. A method according to claim 32 said step of determining one or more PLL parameters including determining the product of the loop gain and loop bandwidth of said PLL by measuring a change in the PLL output frequency caused by temporarily connecting one or more of said derived signals to the input of the PLL.

35. A method according to claim 32, said step of deriving an alternative signal including adding or deleting one or more cycles from said alternative signal.

36. A method of testing a phase locked loop (PLL) having an input, an output and a lock range, by determining a parameter proportional to a Loop Gain-bandwidth, said method comprising the steps of:

applying a stimulus signal whose frequency is within the lock range of the PLL to said input;

applying an alternative signal derived from a feedback signal path of the PLL to said input in place of said stimulus signal;

measuring the frequency of the output of the PLL during a first time interval and recording said frequency as a first frequency;

measuring the frequency of the output of the PLL during a second time interval and recording said frequency as a second frequency;

adding or deleting one cycle from said alternative signal;

measuring the frequency of the output of the PLL during a third time interval and recording said frequency as a third frequency;

determining a first change in frequency by determining the difference between said first and second frequencies and determining a second change in frequency by determining the difference between said second and third frequencies, the Loop Gain-bandwidth being proportional to the difference between said first and second changes in frequency; and comparing said difference against one or more predetermined values to determine whether said PLL passes or fails.

37. A method of testing a phase locked loop (PLL) having an input, an output and a lock range, by determining a parameter proportional to a Loop Gain-bandwidth, said method comprising the steps of:

applying a stimulus signal whose frequency is within the lock range of the PLL to said input;

applying to said input in place of said stimulus signal an alternative signal derived from an internal feedback signal path of the PLL and having a 90E phase shift with respect to said stimulus signal;

counting the number of output cycles of the output of said PLL during a first predetermined number of cycles and storing the number of cycles counted as a first count;

changing the phase shift of said alternative signal to 0E and starting a new count of the output cycles of said PLL;

allowing said PLL to settle during a second predetermined number of cycles; stopping said counting and recording the count as a second count;

determining the difference between said first and second counts, the loop gain-bandwidth being proportional to the difference between said first and second counts; and comparing the difference against one or more predetermined values to determine whether said PLL passes or fails.

38. A circuit for measuring a phase locked loop (PLL) having an input, an output, and a lock range, said circuit comprising:

means for applying to said input a stimulus signal whose frequency is within the lock range of the PLL;

means for deriving alternative signals from a feedback path of the PLL;

means for connecting any of said alternative signals to the input of the PLL;

means for comparing any of said alternative signals to the input signal of the PLL and counting the frequency of errors;

means for measuring the output frequency of the PLL;

means for determining one or more PLL parameters from the change in said output frequency; and means for determining one or more PLL parameters from the delay used to change said frequency of errors.

39. A circuit according to claim 38, also including means for comparing each resulting parameter with respective one or more stored values; where each parameter is compared with the respective stored values to determine whether the PLL passes or fails the test.

40. A circuit according to claim 38, said means for deriving an alternative signal including means for adding or deleting one or more cycles or partial cycles from said alternative signal.

41. A circuit for measuring a phase locked loop (PLL) having an input, an output and a lock range, the circuit comprising:

means for providing a stimulus signal whose frequency is within the lock range of the PLL;

means for connecting a delay T1 to a signal of the PLL;

means for latching the level of the T1-delayed signal, after a programmable delay T2, whenever the PLL output signal has a transition;

means for measuring the amount that the delay T2 changes;

wherein jitter, defined as a time interval between times X1 and X2 at which cumulative probability of a signal transition has probabilities Y1 and Y2, respectively, is measured as follows:

the delay T1 is connected to the stimulus signal of the PLL input;

the output of the PLL becomes phase-locked to the stimulus signal;

the delay T2 is adjusted using an algorithmic search routine, until the number of correct latched levels divided by the total number of latched levels, in a time interval T, is equal to Y1;

the value of T2 is measured, using said means for measuring changes in T2;

the delay T2 is adjusted using an algorithmic search routine, until the number of correct latched levels divided by the total number of latched levels, in a time interval T, is equal to Y2;

the amount by which delay T2 increased is measured, using said means for measuring changes in T2; this amount is approximately equal to X2−X1 which is jitter of the PLL.

* * * * *

UNITED STATES PATENT AND TRADEMARK OFFICE
CERTIFICATE OF CORRECTION

PATENT NO.   : 6,396,889 B1
DATED        : May 28, 2002
INVENTOR(S)  : Sunter et al.

It is certified that error appears in the above-identified patent and that said Letters Patent is hereby corrected as shown below:

Column 11,
Line 65, change "to measure" to -- to measure delay T1. --

Column 15,
After line 15, insert the following line:
-- means for measuring the amount that the delay T2 changes; --

Signed and Sealed this

Twenty-ninth Day of October, 2002

Attest:

Attesting Officer

JAMES E. ROGAN
Director of the United States Patent and Trademark Office